United States Patent
Nakashima et al.

(10) Patent No.: US 6,383,720 B1
(45) Date of Patent: May 7, 2002

(54) METHOD OF MANUFACTURING FINE PATTERN AND PRINTED CIRCUIT BOARD MANUFACTURED WITH THIS METHOD

(75) Inventors: Koji Nakashima, Dazaifu; Toyokazu Yoshino, Fukuoka; Shinobu Kamizuru, Kasuga, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/376,357

(22) Filed: Aug. 18, 1999

(30) Foreign Application Priority Data

Aug. 18, 1998 (JP) .......................................... 10-231233
Nov. 13, 1998 (JP) .......................................... 10-323242

(51) Int. Cl.$^7$ ................................................ C25D 9/06
(52) U.S. Cl. ........................ 430/313; 430/314; 430/319
(58) Field of Search ................................ 430/313, 314, 430/315, 319, 22

(56) References Cited

U.S. PATENT DOCUMENTS

| | | | | |
|---|---|---|---|---|
| 4,326,929 A | * | 4/1982 | Minezaki et al. | 204/15 |
| 4,331,505 A | * | 5/1982 | Hirt | 156/643 |
| 4,751,172 A | * | 6/1988 | Rodriguez et al. | 430/314 |
| 5,202,222 A | * | 4/1993 | Harris et al. | 430/315 |
| 5,209,688 A | * | 5/1993 | Nishigaki et al. | 445/24 |
| 5,304,459 A | * | 4/1994 | Nakamura et al. | 430/311 |
| 5,328,808 A | * | 7/1994 | Sakamoto | 430/313 |
| 5,635,334 A | * | 6/1997 | Borland et al. | 430/311 |
| 5,643,699 A | * | 7/1997 | Waldner | 430/22 |
| 5,834,160 A | * | 11/1998 | Ferry et al. | 430/313 |
| 5,916,735 A | * | 6/1999 | Nakashima et al. | 430/314 |
| 6,020,110 A | * | 2/2000 | Williams et al. | 430/315 |
| 6,162,569 A | * | 12/2000 | Nakashima et al. | 430/7 |

FOREIGN PATENT DOCUMENTS

| | | |
|---|---|---|
| JP | 63 266 482 A | 11/1988 |
| JP | 3-150378 | 6/1991 |
| JP | 06 301 198 A | 10/1994 |
| JP | 09 272 345 A | 10/1997 |

OTHER PUBLICATIONS

Fischer, Johannes, and Dennis E. Weimer. Precious Metal Plating. Teddington: Robert Draper LTD, 1964.*
Stuart, R.V. Vacuum Technology, Thin Films, and Sputtering. New York: Academic Press, Inc., 1983, pp. 91–135.*

* cited by examiner

*Primary Examiner*—Janet Baxter
*Assistant Examiner*—Barbara Gilmore
(74) *Attorney, Agent, or Firm*—Parkhurst & Wendel, L.L.P

(57) ABSTRACT

A method of manufacturing fine pattern of the invention comprises (a) a step of manufacturing a master substrate having a film of precious metal or an alloy thereof formed as an insoluble electrode on the electrode, (b) a step of forming a fine pattern film on the insoluble electrode with anion type electro-deposition, and (c) a step of exfoliating and transferring the fine pattern film onto another substrate. Another method of manufacturing fine pattern further includes a step of manufacturing a master substrate, of which a surface is provided with at least a repeatedly reproducible sacrificial electrode. Still another method of manufacturing fine pattern includes a step of forming a pattern electrode on a conductive substrate by electroforming, and transferring the electrode onto another substrate. Yet another method of manufacturing fine pattern includes a structure wherein a transparent section is provided in a portion of a master substrate in order to facilitate a positional alignment. The invention provides reliable and accurate mass production of fine-line and high-density films of fine pattern having good transfer ability and durability at low cost. A fine-line and high-density printed circuit board can be made at low cost with the methods of manufacturing fine pattern as disclosed above.

7 Claims, 17 Drawing Sheets

FIG. 4
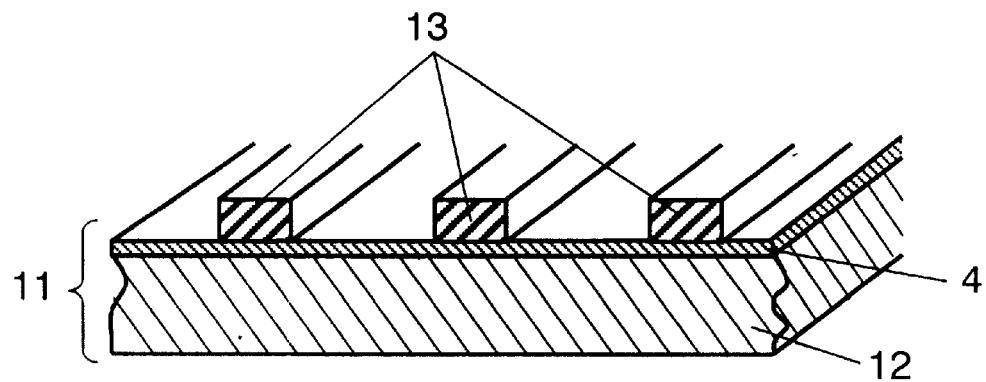
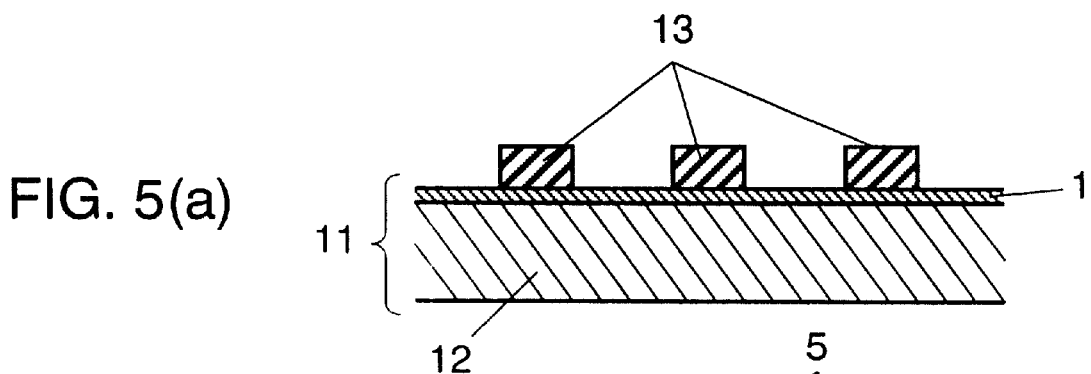
FIG. 5(a)
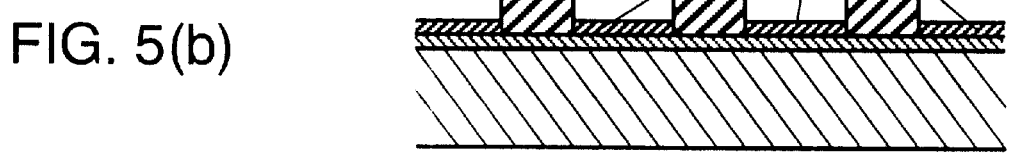
FIG. 5(b)
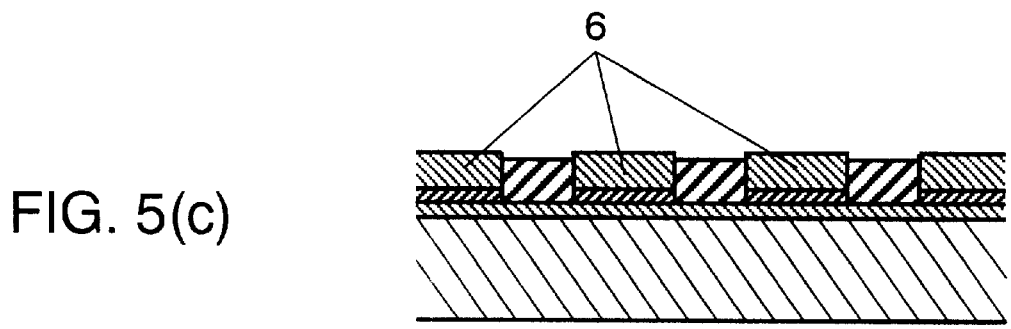
FIG. 5(c)

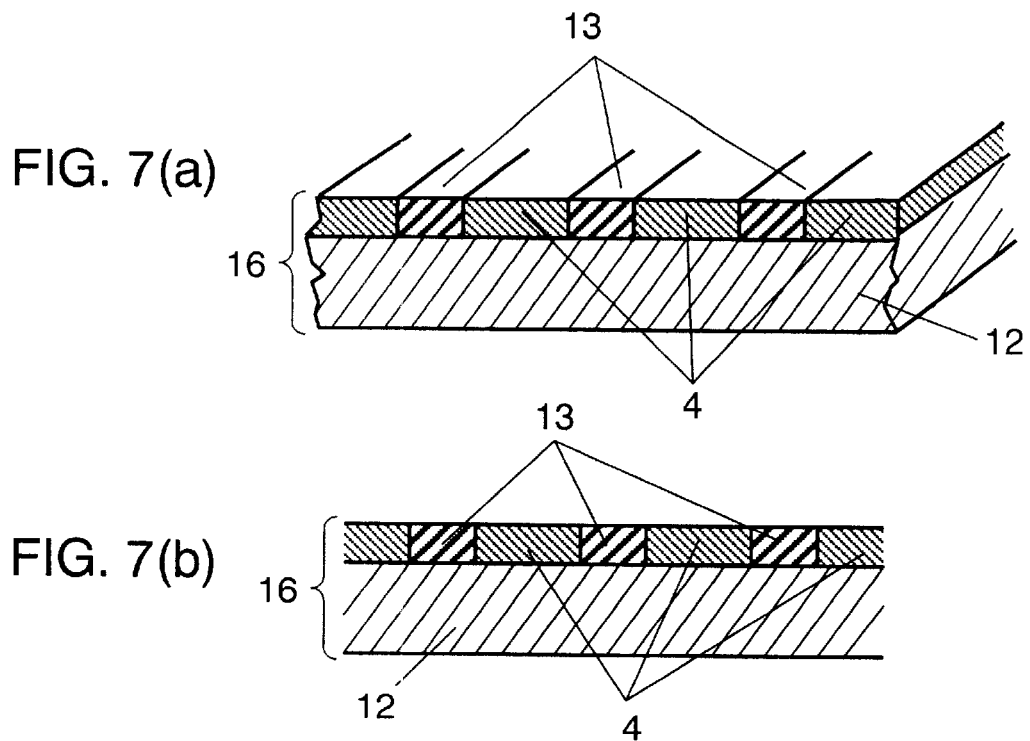
FIG. 7(a)
FIG. 7(b)
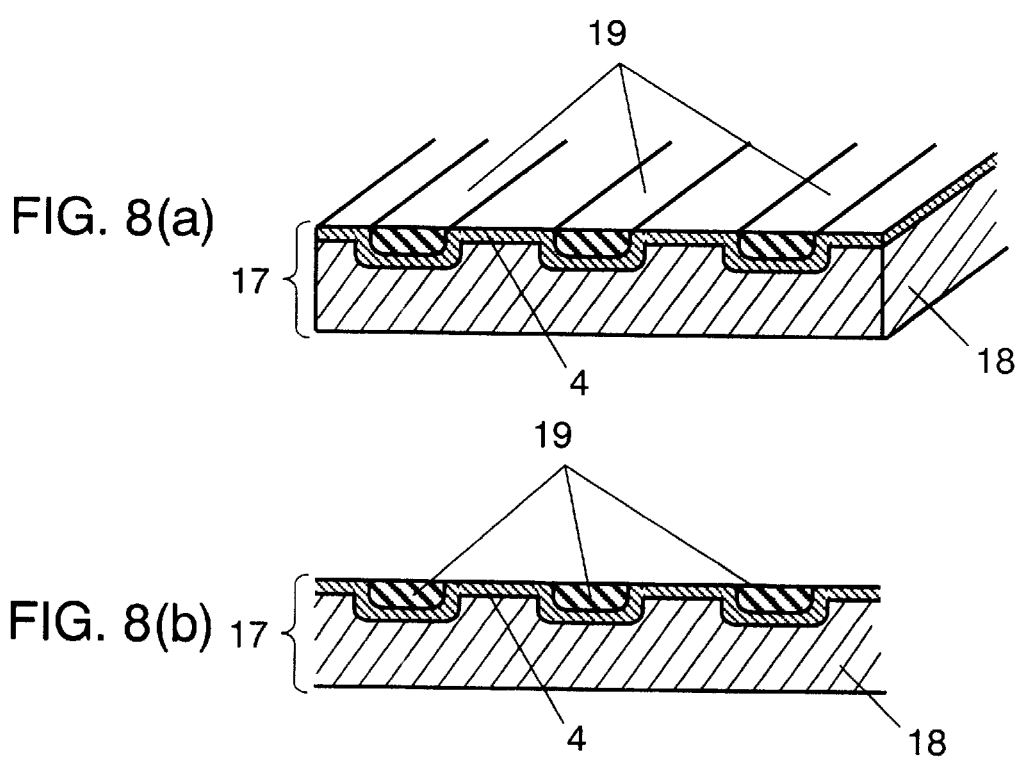
FIG. 8(a)
FIG. 8(b)

METHOD OF MANUFACTURING FINE PATTERN AND PRINTED CIRCUIT BOARD MANUFACTURED WITH THIS METHOD

FIELD OF THE INVENTION

The present invention relates to a method of manufacturing fine pattern, and a printed circuit board manufactured by using this method. In particular, the invention relates to a method of manufacturing fine pattern suitable for use as an etching mask and a plating mask in manufacturing a printed circuit board, and a printed circuit board manufactured by using the fine pattern. The fine pattern is used when manufacturing fine line and high density printed circuit boards, multi-layered printed circuit boards, flexible printed circuit boards and the like which are incorporated into semiconductor packaging such as IC cards, and electronic equipment such as portable information terminals.

BACKGROUND OF THE INVENTION

The conventional method of manufacturing a print circuit board (hereinafter referred to as "PCB") includes a subtracting method, in which circuit conductors are formed by making up a predetermined insulating pattern over a copper foil on a surface of a copper clad laminate, followed by removal of any unnecessary portion of the copper foil with an etching process. Another method of manufacturing a PCB, among others, is an additive method, in which circuit conductors are formed by applying a catalyzer over a surface of an insulation substrate, followed by formation of a predetermined insulating pattern, and an electroless copper plating.

On the other hand, photolithography is one method of forming an insulating fine pattern on a substrate surface, by applying a photosensitive resist on the substrate, exposing, and developing it. This method is used commonly in the method contains a complicated manufacturing process, since it requires an application and exposure of photosensitive resist for every layer of circuits. Also, the products manufactured by the photolithography method have been expensive, because various kinds of equipment are used. For example, necessary equipment for exposure of ultraviolet rays to the photoresist is expensive.

On the other hand, there are printing methods for forming a fine pattern directly on a substrate, as means of forming the insulating fine pattern in a shape of circuits on the substrate at lower cost. Although there are such printing methods as offset printing, screen printing, and the like methods, it is not feasible to form a pattern of 100 $\mu$m or less in width with any of these methods in mass-production. In addition, the printing methods are not suitable for making a pattern of high definition, since they are not considered satisfiable in respect of reproducibility.

Therefore, the photolithography, which is superior in quality, even though it is more costly, has been utilized principally in order to satisfy a demand for PCB's of thinner film, higher density and increased layers with the latest progress of semiconductors requiring higher operating frequencies, and electronic devices for downsizing and greater integration.

Under the situation as described, a new method has been desired for forming fine pattern with a simple process and economically low cost, while maintaining high quality. Several methods have been devised in attempting to improve preciseness while also obtaining a simplification and low cost in the manufacturing process of forming fine pattern. Some of the methods will be described hereinafter.

According to the teaching of Japanese Patent Laid-Open Publication, Number S63-266482, a method is suggested, in that a fine pattern film in high precision is formed first on a master substrate. A fine pattern film is then transferred onto another substrate. The above method of forming fine pattern is utilized for manufacturing a color filter. In the manufacturing, it uses an insulating master substrate having an electrode corresponding to a shape of the color filter on its surface. A fine pattern film made of resin is formed by electro-depositing the resin on the electrodes corresponding to each color of the master substrate. The fine pattern film is then tightly pressed onto another substrate, to exfoliate and transfer the fine pattern film onto the substrate by making full use of the electro-deposited resin's own tackiness. This method is superior in economical standpoint, because the master substrate can be used repeatedly, thereby eliminating an exposure operation for each PCB during the process of forming the fine pattern film. However, the fine pattern film has a weak adhesion to the substrate being transferred, since the exfoliation and transference is made only by the electro-deposited resin's own tackiness. At the same time, it has a shortcoming in that a full transference cannot be made reliably due to a strong adhesion of the fine pattern film to the master substrate.

Also, there is a kind of master substrate for forming fine pattern, as disclosed in Japanese Patent Laid-Open Publication, Number H06-301198, as an example. It discloses a method in which a layer of photo-resist in a shape of fine pattern is formed on a thermally oxidizable metal plate such as stainless steel, titanium and tantalum, or a nitridable metal plate such as titanium and silicon. An insulating pattern-masking layer composed of oxide film or nitride film is then formed by thermally oxidizing or nitriding a portion not covered by the layer of photo-resist. The metal plate produced in the above step is used as a master substrate for forming the fine pattern. The insulating pattern-masking layer has a strong adhesion to the master substrate, since the insulating pattern-masking layer is produced from the thermally oxidizable metal plate or the nitridable metal plate. There have been problems even with this master substrate, such as deterioration of a fine pattern film, low in yield, and a short usable life of the master substrate. The fine pattern film needs to be separated forcedly in order to totally exfoliate and transfer the film due to the strong adhesion of the film to the master substrate.

On the other hand, the inventors of this application have devised and disclosed in Japanese Patent Laid-Open Publication, Number H09-272345, a method of manufacturing fine pattern, which weakens adhesion of a fine pattern film made of electro-deposited resin to a master substrate, thereby enabling complete exfoliation and transference of the film. The method disclosed by the inventors uses a master substrate having a pattern electrode layer in a predetermined shape on the substrate, and an exfoliation layer composed of a thin water repellent film formed on the master substrate. Furthermore, a fine pattern film is formed on the master substrate by electro-depositing, and the film is hydrated with hot water in temperature of not less than 40° C. but not more than 90° C. The hydration, i.e. impregnation of water, of the fine pattern film can weaken adhesion due to water repellency of the exfoliation layer on a surface of the master substrate. In addition, a surface of the fine pattern film is warmed so as to turn it into a state of tackiness. Therefore, the above method is able to exfoliate and transfer the fine pattern film completely onto a substrate subject to be transferred.

The method of forming fine pattern, as described above, is to form a fine pattern film on a master substrate with electro-depositing, and to exfoliate and transfer the film onto a substrate subject to be transferred. This method is able to form the fine pattern film of high quality, if the master substrate is precisely made. The method is also capable of producing the fine pattern film easily at low cost with quite a simple process, since it does not require use of photolithography for each of every formation of the fine pattern, and it can allow repeated use of the same master substrate.

However, there are two types of electro-depositing, anion type and cation type depending on electric charge of the ionic radical introduced into an electro-deposited resin. In the case of utilizing an electro-deposited film for forming a fine pattern as disclosed in the above-cited invention, an anion type electro-deposition is suitable in order to avoid mingling gas bubbles in the electro-deposited film, since the anion type does not generate many gas bubbles during the process of the electro-deposition. However, the anion type electro-deposition causes deposition of the electro-deposited film in a positive electrode, resulting in an erosion of the electrode as a side reaction caused by electrolysis of water. As a result, the pattern electrode layer on the master substrate deteriorates causing shortening usable life for the master substrate.

Also, Japanese Patent Laid-Open Publication, Number H03-150376 discloses an adoption of a master substrate, in which a photo-resist layer in negative form corresponded to a fine pattern is formed on an electrically conductive substrate. This method electro-deposits a film of pattern on a portion of the master substrate not covered by the photo-resist layer with electro-deposition, and exfoliates and transfers the film on a substrate subject to be transferred with a pressure sensitive or a conventional adhesive, in order to obtain fine pattern. Even with these master substrates, the fine pattern film needs to be separated forcibly, since the fine pattern has a strong adhesion to the electrically conductive substrate. Hence, a problem still exists where a yield of products is unsatisfactory due to damages, etc. of the fine pattern. It also has a short life for repeated use due to damages to the master substrate because of the forced separation. The cited publication also discloses another method for making a master substrate by forming a pattern electrode on an electrically conductive substrate with pattern-etching. An insulating resin is placed in a recessed portion on the etched substrate. And a fine pattern, which is formed on a surface of the pattern electrode with electro-deposition, is exfoliated and transferred onto a substrate subject to be transferred. However, this method still has a problem as the preciseness is less satisfactory when compared with a fine pattern formed with the photo-resist layer, although the master substrate can be manufactured at low cost with the pattern-etching.

An object of the present invention is to deal with the foregoing problems of the prior art, and aims at disclosing a method of manufacturing fine pattern, which reliably provides mass-produced films of fine pattern in fine line and high density at low cost, with use of a master substrate having a superior transferability and durability, as well as high pattern accuracy.

Another object of the present invention is to provide a fine-line and high-density PCB manufactured using above method at low cost.

SUMMARY OF THE INVENTION

A method of manufacturing fine pattern of the present invention comprises the steps of:
(a) a master substrate manufacturing step for producing a master substrate, a surface of which is provided with at least an insoluble electrode film made of precious metal such as gold and platinum, or their alloy;
(b) a fine pattern formation step for forming a fine pattern film on the insoluble electrode film with an anion type electro-deposition; and
(c) an exfoliation-and-transferring step for transferring the fine pattern film formed on the master substrate onto a substrate subject to be transferred by adhering the fine pattern film onto the substrate, and exfoliating it from the master substrate. In the foregoing structure where the insoluble electrode film is provided on the master substrate, an erosion of the electrode due to the anion type electro-deposition is avoided. As a result, this method realizes use of the anion type electro-deposition that generates only a small amount of gas bubbles, so as to produce the fine pattern with high yield.

Also, a second method of manufacturing fine pattern of the present invention comprises the steps of:
(a) a master substrate manufacturing step for producing a master substrate, a surface of which is provided with at least a sacrificial electrode layer that is reproducible repeatedly with plating;
(b) a fine pattern formation step for forming a fine pattern film on the sacrificial electrode film with an anion type electro-deposition; and
(c) an exfoliation and transferring step for transferring the fine pattern film formed on the master substrate onto a substrate subject to be transferred by adhering the fine pattern film onto the substrate, and exfoliating it from the master substrate. This method provides for the sacrificial electrode layer on the master substrate, and thereby the electrode layer can be readily reproduced repeatedly even if the anion type electro-deposition causes erosion of the electrode.

Furthermore, a third method of manufacturing fine pattern of the present invention comprises the steps of:
(a) a first step for producing a master substrate by forming an electrically conductive pattern electrode on an electrically conductive substrate with electro-forming, and exfoliating and transferring the pattern electrode, whereby an exfoliated surface of the transferred pattern electrode is exposed;
(b) a second step for forming a film of pattern with electro-deposition on an exfoliated surface of the pattern electrode transferred onto the master substrate; and
(c) a third step for transferring the film of pattern on a substrate subject to be transferred. The foregoing method improves a transferring ability of the master substrate and accuracy of the film of pattern, thereby exfoliation and transferring of the film can realize mass-production of fine pattern of fine line and high density with high quality and high yield.

BRIEF DESCRIPTION OF THE DRAWINGS

FIG. 4 is a perspective view, in cross-section, illustrating an essential portion of a master substrate for use in manufacturing fine pattern by a method of a second exemplary embodiment of the present invention;

FIG. 5(a) is a cross-sectional view illustrating an essential portion of the master substrate in the second exemplary embodiment of the present invention;

FIG. 5(b) is a cross-sectional view illustrating a step of forming an exfoliation layer in the second exemplary embodiment of the present invention;

FIG. 5(c) is a cross-sectional view illustrating a step of forming a fine pattern film in the second exemplary embodiment of the present invention;

FIG. 7(a) is a perspective view, in cross-section, illustrating an essential portion of a master substrate for use in manufacturing fine pattern by a method of a third exemplary embodiment of the present invention;

FIG. 7(b) is a cross-sectional view illustrating an essential portion of the master substrate in the third exemplary embodiment of the present invention;

FIG. 8(a) is a perspective view, in cross-section, illustrating an essential portion of another master substrate for use in manufacturing fine pattern by a method of the third exemplary embodiment of the present invention;

FIG. 8(b) is a cross-sectional view illustrating an essential portion of the another master substrate in the third exemplary embodiment of the present invention;

DESCRIPTION OF THE PREFERRED EMBODIMENTS

Figure 1:
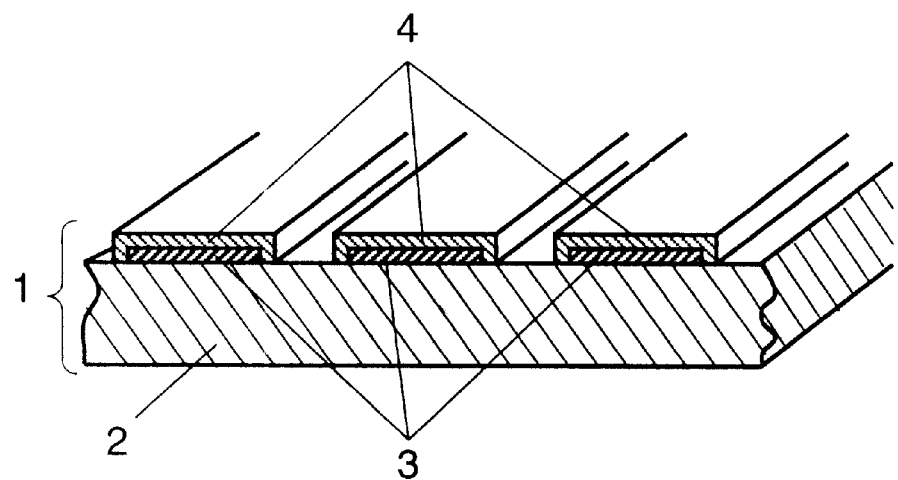
FIG. 1 is a perspective view, in cross section, illustrating an essential portion of a master substrate for use in manufacturing fine pattern by a method of a first exemplary embodiment of the present invention.

Exemplary embodiments of the present invention will be described hereinafter with reference to the accompanied figures. In the figures, identical components are assigned same reference numerals, and their description will be made in a manner to avoid duplications. Also, numerical values shown in the following exemplary embodiments represent merely an example among numerous selectable values, and these values are not critical for practicing this invention.

First Exemplary Embodiment

A method of manufacturing fine pattern of a first exemplary embodiment of the present invention is described hereinafter. The first exemplary embodiment of the present invention utilizes a fine pattern as an etching mask in manufacturing a print circuit board ("PCB").

FIG. 1 is a perspective view, in cross-section, illustrating an essential portion of a master substrate for use in manufacturing fine pattern in the first exemplary embodiment of the present invention. In FIG. 1, the master substrate 1 is used for forming an electro-deposited film having a fine pattern by an anion type electro-depositing. The electro-deposited film having a shape of the fine pattern formed in a step of forming fine pattern is exfoliated and transferred onto a second substrate after a step of hydration. The master substrate 1 comprises an insulating substrate 2 made of glass or the like material, a pattern electrode layer 3 for forming on the insulating substrate 2 an etching mask for a circuit conductor of a predetermined shape, and an insoluble electrode film 4 of thin gold film or the like formed on the pattern electrode layer 3.

Figure 2A:
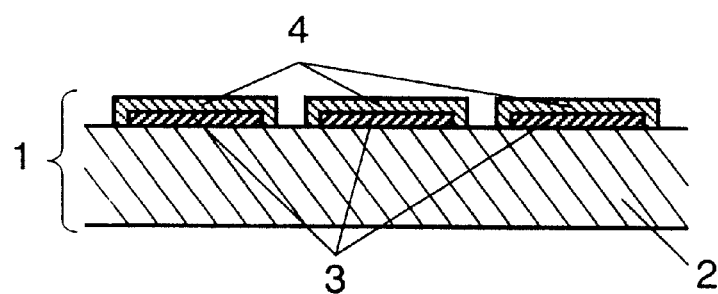
FIG. 2(a) is a cross-sectional view illustrating an essential portion of the master substrate in the first exemplary embodiment of the present invention.

A master substrate manufacturing step for making the master substrate 1 through a fine pattern formation step for forming a fine pattern film with electro-depositing will be described now by referring to FIG. 2(a) through FIG. 2(c). FIG. 2(a) is a cross-sectional view illustrating the master substrate 1, FIG. 2(b) is a cross-sectional view illustrating a step of forming an exfoliation layer, and FIG. 2(c) is a cross-sectional view illustrating a step of forming a fine pattern film, in the present exemplary embodiment of the invention.

FIG. 2(a) will be described first. A thin nickel film with a thickness of 0.5 $\mu$m is formed on the insulating substrate 2 of glass plate by using sputtering or the like method. It is coated, next, with positive-type photoresist with a thickness of approximately 2 $\mu$m by spin coating. A resist pattern corresponding to the pattern electrode layer 3 is formed by exposing the photoresist with a photo mask, followed by development with aqueous solution of sodium carbonate. The thin nickel film on the insulating substrate 2 is etched with etching liquid of acidic aqueous solution by utilizing the resist pattern as an etching mask. The pattern electrode layer 3 thus has a fine pattern formed by removing the foregoing resist pattern with aqueous solution of sodium hydroxide or the like. Next, an insoluble electrode film 4 composed of gold and having a thickness of 1 $\mu$m is formed by plating on the pattern electrode layer 3. The master substrate 1, as shown in FIG. 2(a), is produced for use in the method of manufacturing fine pattern of the first exemplary embodiment of the present invention. As another method of producing the master substrate 1, an insoluble electrode film 4 may be formed on an electrode layer 3, which is formed by adhering a metal foil on the insulating substrate 2 with adhesive resin, and etching the metal foil in the same manner as above.

Figure 2B:
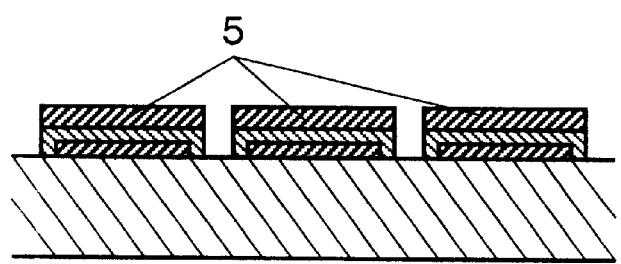
FIG. 2(b) is a cross-sectional view illustrating an essential portion of the master substrate in a step of forming an exfoliation layer in the first exemplary embodiment of the present invention.
Figure 2C:
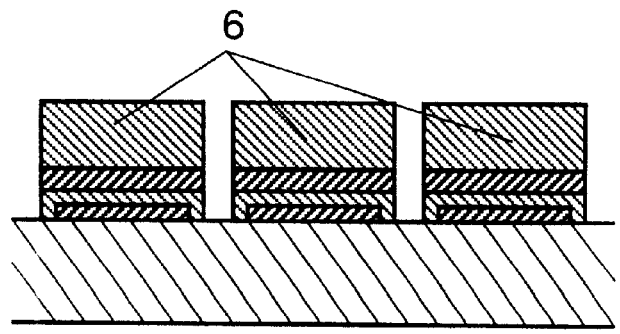
FIG. 2(c) is a cross-sectional view illustrating an essential portion of the master substrate in a step of forming a fine pattern film in the first exemplary embodiment of the present invention.

An exfoliation layer 5 having water repellency and electric conductivity in an electro-deposition bath is then formed on the insoluble electrode film 4, as shown in FIG. 2(b). The exfoliation layer 5 is illustrated with the thickness enlarged intentionally in the figure for a help of understanding. Next, a film 6 of fine pattern of electro-deposited resin is formed with a thickness of 2 $\mu$m over a surface of the exfoliation layer 5 on the insoluble electrode film 4 by electro-deposition using an anion-type electro-deposition bath of acrylic resin, as shown in FIG. 2(c). The electro-deposition resin bath contains phthalocyanine blue pigment in a concentration of 30 ml/l. The present invention can improve durability and prolong a usable life of the master substrate 1, because the insoluble electrode film 4 covers a deposition electrode of the anion-type electro-deposited film, so as to avoid erosion of the electrode.

A step of exfoliation and transferring for exfoliating and transferring the film 6, formed in the above step of the present exemplary embodiment, onto a substrate to be transferred will be described now by referring to FIGS. 2(d)

through 2(f). FIG. 2(d) is a cross-sectional view illustrating a step of hydration, FIG. 2(e) is a cross-sectional view illustrating a step of exfoliation and transferring, and FIG. 2(f) is a cross-sectional view illustrating an exfoliated and transferred fine pattern film, in the first exemplary embodiment.

Figure 2D:
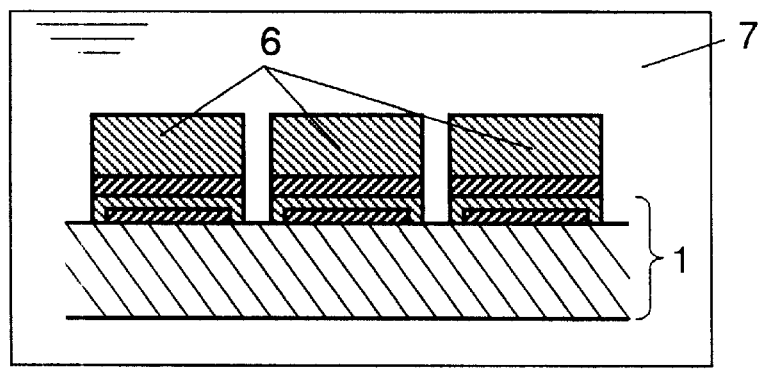
FIG. 2(d) is a cross-sectional view illustrating a step of hydration in the first exemplary embodiment of the present invention.
Figure 2E:
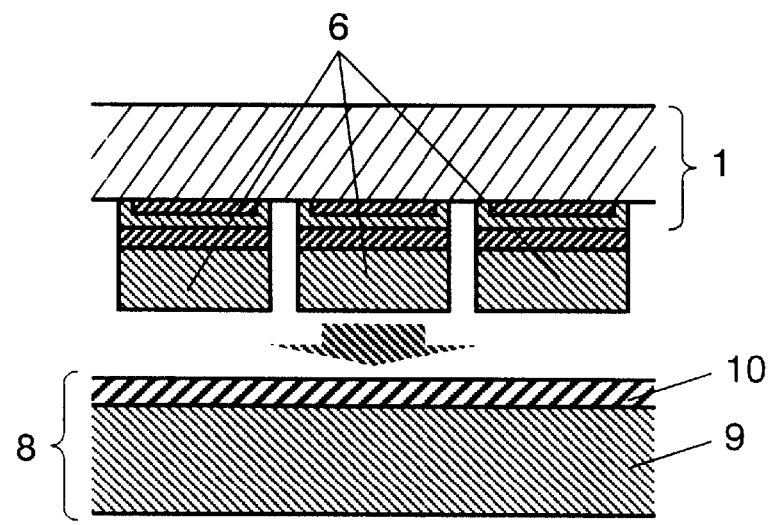
FIG. 2(e) is a cross-sectional view illustrating a step of exfoliation and transference in the first exemplary embodiment of the present invention.
Figure 2F:
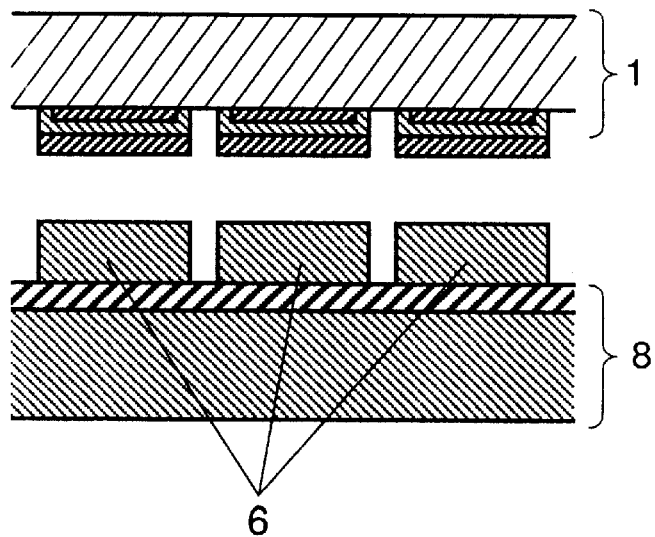
FIG. 2(f) is a cross-sectional view illustrating an essential portion of a fine pattern film exfoliated and transferred in the first exemplary embodiment of the present invention.

First, the film 6 is hydrated with a sufficient amount of hot water, and warmed up by immersing the master substrate 1, on which the film 6 is formed, into hot water 7 of 70° C. for 1 minute, as shown in FIG. 2(d). Next, a substrate 8 to be transferred composed of a flexible polyimide film 9, a surface of which is laminated with a copper foil 10 having a thickness of 18 $\mu$m, is prepared. The master substrate 1, which has been warmed such that a surface of the film 6 which becomes tacky, is then removed from the hot water 7, and the film 6 is adhered to the substrate 8 with pressure. The film 6 in contact with the master substrate 1 contains moisture resulted from the immersion in the hot water 7, so that it remains in a state of very weak adhesion to the master substrate 1 during this moment due to water repellency of the exfoliation layer 5. Therefore, the film 6 can be easily exfoliated and transferred completely onto the substrate 8, as shown in FIG. 2(f), when the master substrate 1 is separated from the substrate 8. The master substrate 1 is utilized repeatedly for transferring of the film 6, beginning at FIG. 2(d), as a new film 6 is formed again on the master substrate 1 by electro-deposition after the above step of exfoliation and transferring.

Figure 3A:
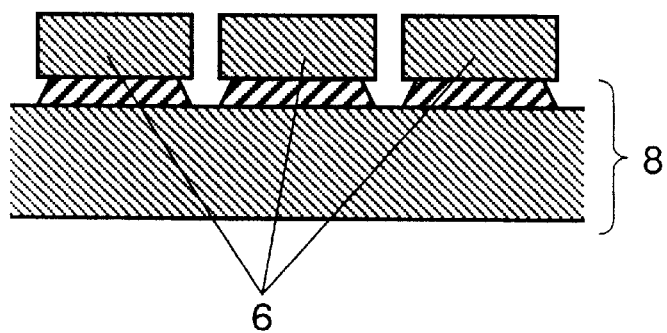
FIG. 3(a) is a cross-sectional view illustrating a step of etching in the first exemplary embodiment of the present invention.
Figure 3B:
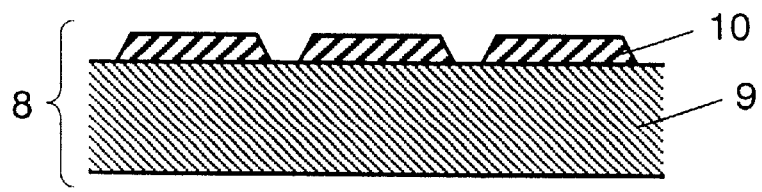
FIG. 3(b) is a cross-sectional view illustrating an essential portion of a copper circuit land formed by etching in the first exemplary embodiment of the present invention.

An etching step using the film 6, which is exfoliated and transferred onto the substrate 8, as an etching mask will be described next by referring to FIG. 3(a) and FIG. 3(b). First, the film 6 transferred onto the surface of the substrate 8 is dried by heating it for 30 minutes at 140° C. in order to increase a adhesion strength to the copper foil 10. Next, an exposed portion of the copper foil 10 is removed by etching with aqueous solution of iron chloride or the like chemical by utilizing the heat-dried film 6. The film 6 is then removed by aqueous solution of sodium hydroxide heated to 70° C. The foregoing steps can produce a high precision and high density PCB comprising a fine pattern circuit of copper formed on the polyimide film 9 as shown in FIG. 3(b), at low cost.

Precious metals such as gold, platinum and the like, or an alloy of them may be used as a material of the insoluble electrode film 4 in the present invention. A film of these precious metals can be formed by a wet processing such as plating, or a dry processing such as sputtering or the like.

According to an experiment relating to erosion of the electrode layer conducted by the inventors, a copper pattern electrode layer was decreased in thickness by 4 nm due to erosion per each electro-deposition of forming an anion type electro-deposited film of 2 $\mu$m thickness. On the other hand, a nickel electrode layer was eroded and decreased in a thickness by 0.4 nm per each electro-deposition, in the case of the electrode layer made of nickel.

However, erosion of gold film was not found, when a thin gold film in thickness of 1 $\mu$m was plated on a surface of the copper electrode, as the insoluble electrode film 4 in the present exemplary, even if the anion type electro-deposited film was formed directly on the thin gold film. Likewise, no erosion was found in the case of thin platinum film, thin films of gold alloy and platinum alloy. It was found accordingly that use of precious metal such as gold, platinum, or an alloy of them can prevent erosion of the electrode from occurring during the anion type electro-deposition, and thereby the precious metals are effective for improving durability and prolonging a usable life of the master substrate.

Further, in the case of using thin gold films, each having a thickness of 0.2 $\mu$m, 0.5 $\mu$m, 0.7 $\mu$m and 1 $\mu$m, as the insoluble electrode films 4 formed on the surface of the electrode layer, no erosion was found on the thin gold films of all these thicknesses. However, it was proved that the copper pattern electrode under the gold film eroded, in the case of using a thin gold film of 0.2 $\mu$m thickness. It is considered that the pattern electrode layer under the gold film eroded through fine pores penetrating through the gold film, if the insoluble electrode film 4 is so thin. Therefore, it is determined that the insoluble electrode films 4 having a thickness of 0.5 $\mu$m or more can eliminate the pores as being the cause of erosion, thereby realizing an improvement of durability and prolonging of usable life of the pattern electrode layer.

Also, erosion of the pattern electrode progresses through a defect in the insoluble electrode film 4, if repeated use of the master substrate 1 develops such a defect in the insoluble electrode film 4 that reaches to the pattern electrode. In this instance, the erosion of the base electrode due to the defect can be retarded by forming a nickel film which is small in amount of erosion or the like under the insoluble electrode film 4. Further, reformation of the insoluble electrode film 4 over the defected portion with plating or the like method, as the need arises, can prolong a usable life of the master substrate 1 for repeated usage. Moreover, the nickel film or the like formed under the insoluble electrode film 4 also gives an effect of improving a adhesion strength of the insoluble electrode film 4. Also, the pattern electrode 3 comprising the insoluble electrode film 4 alone can avoid erosion of the pattern electrode, so as to attain further improvement of durability and prolongation of usable life of the pattern electrode layer 3.

Material of the exfoliation layer 5 in the present exemplary embodiment will be described next. A thin film of fluorinated graphite or the like formed by vacuum process such as sputtering and the like method is an example of the material of the exfoliation layer 5. A water-repellent film of fluorocarbon coating agent such as fluorocarbon oil and the like formed by the ordinary method of coating or dip coating may also be used. As, both of the fluorinated graphite film and the fluorocarbon coating agent intrinsically have low electric conductivity, only a thin film of them can obtain a sufficient electrical conductivity for enabling the electro-deposition in an electro-deposition bath while maintaining the water-repellency. Such a condition is obtained if the film is formed in thickness of no less than 5nm, but no more than 100 nm.

According to an experiment conducted by the inventors for forming thin films of fluorinated graphite, each having a thickness of 5 nm, 15 nm, 30 nm and 100 nm, as an exfoliation layer 5 over the insoluble electrode film 4, by means of sputtering, it was possible to electro-deposit a fine pattern film with the fluorinated graphite film in any of the thicknesses. It was also found at the same time that the exfoliation layer 5 retains enough water-repellency to weaken adhesive strength of the film 6 to the exfoliation layer 5 sufficiently when the film 6 of fine pattern is hydrated, if the exfoliation layer 5 has a thickness in the above-cited range. It was not possible, however, for a fluorinated graphite film in thickness of 200 nm to accept electro-deposition of the film 6, since it was not electrically conductive. On the other hand, a fluorinated graphite film in thickness of 3 nm scarcely had enough of a water-repellant that it was hardly possible to sufficiently weaken adhesive strength of the film 6, even though electro-deposition was possible. In others words, it was found desirable for a thickness of the exfoliation layer 5 to be in a range greater than 5 nm and less than 100 nm.

Furthermore, there are useful fluorocarbon coating agents such as fluorocarbon oil, per-fluorocarbon oil, and the like. It is preferable for these fluorocarbon coating agents to have a terminal radical of either SiXn ("n" represents an integral number of 3 or less) or TiYn ("n" represents an integral number of 3 or less), where symbols X and Y denote hydrolysis functional radicals. These compounds react with a hydroxyl radical and the like on a surface of the insoluble electrode film 4 or a surface of a sacrificial electrode to thereby adhere more firmly. These compounds can therefore improve durability of the exfoliation layer 5 when using the master substrate 1 repeatedly.

The exfoliation layer 5 can be formed easily into a desired thickness by a dip coating or the like method, especially if perfluoro-polyether having a silicone group or the titanium group is used as a terminal radical. It was found that the water-repellent film could be formed uniformly over the master substrate 1, since the water-repellent film obtained here had an electrical conductivity in liquid because of its thinness.

There were cases in the present exemplary embodiment, that the film 6 could not be exfoliated and transferred completely onto the substrate 8, due to deficiency of tackiness for lack of warming the surface of the film 6, when the water temperature was 25° C.

On the other hand, the surface of the film 6 came to a state of tackiness by warming with warm water at temperatures of 40° C., 50° C., 60° C., 70° C., 80° C. and 90° C. Moreover, the film 6 could be exfoliated and transferred completely and repeatedly with good reproducibility, since the film 6 was internally hydrated to be in a state of weak adhesion due to water repellency of the exfoliation layer 5 on the surface of the master substrate 1. An amount of moisture contained in the film 6 decreases due to evaporation after the film 6 is pulled out of the hot water, particularly at temperature of 80° C. or 90° C. However, use of a water-repellent film composed of perfluoro-polyether used in this embodiment for the purpose of exfoliation layer 5 can realize a substantial effect of water repellency even with a small amount of moisture, thereby enabling a full exfoliation and transferring of the film 6.

In the case of using hot water at the temperature of 95° C., however, the film 6 could not be exfoliated and transferred completely even with the use of the water-repellent film composed of perfluoro-polyether, since the high temperature caused the moisture to evaporate and escape from the film 6.

The foregoing facts revealed an effectiveness of the present invention with hot water in a temperature range of not lower than 40° C. and not higher than 90° C. for the purpose of immersing the master substrate 1. Especially, it is more desirable to keep the water temperature near 70° C., since this temperature helps complete a work of the exfoliation and transferring in a short period of time.

Moreover, the film 6 contains fine particles such as pigment as an aggregate, beside the electro-deposited resin, in the first exemplary embodiment, for a purpose of preventing the film 6 from deforming. Containment of the fine particles other than the electro-deposited resin reduces tackiness by warming of the film 6. However, the master substrate 1 can be used repeatedly while maintaining a shape of the fine pattern even with the film 6 that is not easy to deform and low in tackiness, because of the construction of this invention, in which the film 6 is hydrated to weaken adhesive strength to the master substrate 1 by making good use of water-repellency of the of exfoliation layer 5. That is, the present invention can realize a full exfoliation and transferring with good reproducibility, even when the film 6 is not easy to deform and low in tackiness.

Second Exemplary Embodiment

A method of manufacturing fine pattern of a second exemplary embodiment of the present invention is described hereinafter. The second exemplary embodiment of the present invention utilizes a fine pattern as a plating mask in manufacturing a PCB.

FIG. 4 is a perspective view, in cross-section, illustrating an essential portion of a master substrate for use in manufacturing fine pattern in the method of the second exemplary embodiment of this invention. In FIG. 4, the master substrate 11, on which a fine pattern is formed by anion type electro-depositing, has an effect of exfoliating and transcribing a film of the fine pattern on a substrate to be transferred. The master substrate 11 comprises an electrically conductive substrate 12 made of a copper plate or the like material, an insoluble electrode film 4 formed on the conductive substrate 12, and an insulation layer 13 formed in a shape of pattern on the insoluble electrode film 4.

A master substrate manufacturing step for making the master substrate 11 through a fine pattern formation step for forming a fine pattern film with electro-deposition will be described now by referring to FIG. 5(a) through FIG. 5(c). FIG. 5(a) is a cross-sectional view illustrating the master substrate 11, FIG. 5(b) is a cross-sectional view illustrating a step of forming an exfoliation layer, and FIG. 5(c) is a cross-sectional view illustrating a step of forming the fine pattern film, in the present exemplary embodiment.

First, the insoluble electrode film 4 comprising a thin nickel film in thickness of 0.5 $\mu$m and a thin gold film in thickness of 0.5 $\mu$m is formed by plating on the conductive substrate 12 of a copper plate or the like. Formation of the thin nickel film, of which an amount of erosion is small, as a base of the insoluble electrode film 4 can retard erosion of the insoluble electrode film 4 due to a defect developed in it by repeated usage of the master substrate 11. Formation of the thin nickel film also increases a strength of adhesion of the insoluble electrode film 4 to the conductive substrate 12.

Furthermore, reformation of the insoluble electrode film 4 over the defected portion with plating or the like method, as the need arises, can prolong a usable life of the master substrate 11 for repeated usage.

A resist pattern for founding the pattern insulation layer 13 is formed next by coating photo-sensitive polyimide resin in a thickness of 30 $\mu$m with spin coating, exposing it through a photo mask, followed by development with solution of N-methyl pyrrolidone group chemical. The pattern insulation layer 13 in thickness of 20 $\mu$m made up of polyimide resin having heat resistance and durability is then formed by thermally curing the resist pattern. The master substrate 11 for use in manufacturing fine pattern in the method of the present exemplary embodiment is now completed according to the foregoing steps.

Next, an exfoliation layer 5 having water-repellency and electric conductivity in an electro-deposition bath is formed on the insoluble electrode film 4, as shown in FIG. 5(b). After that, a film 6 is formed in thickness of 25 $\mu$m over a surface of the exfoliation layer 5 by electro-deposition using an anion-type electro-deposition bath of acrylic resin, as shown in FIG. 5(c). The electro-deposition resin bath contains phthalocyanine blue pigment in a concentration of 30 ml/l. Containment of fine particles such as the pigment beside the electro-deposited resin in the film 6 helps to make the film 6 to become difficult to deform in shape during exfoliation and transferring, since the fine particles serve as an aggregate.

An exfoliating and transferring the film 6, formed in the foregoing step in the present exemplary embodiment of the invention, onto a substrate subject to be transferred will be described now by referring to FIG. 5(d) through FIG. 5(f).

Figure 5D:
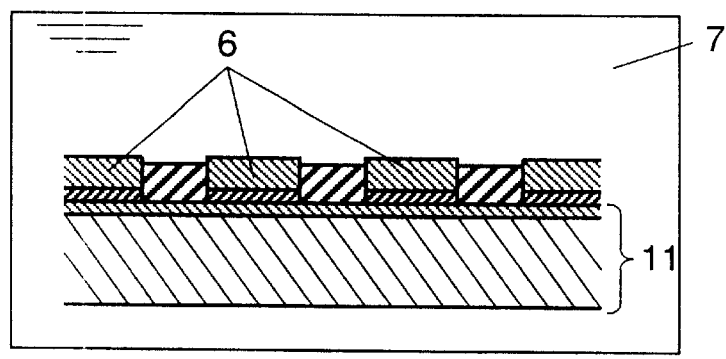
FIG. 5(d) is a cross-sectional view illustrating a step of hydration in the second exemplary embodiment of the present invention.
Figure 5E:
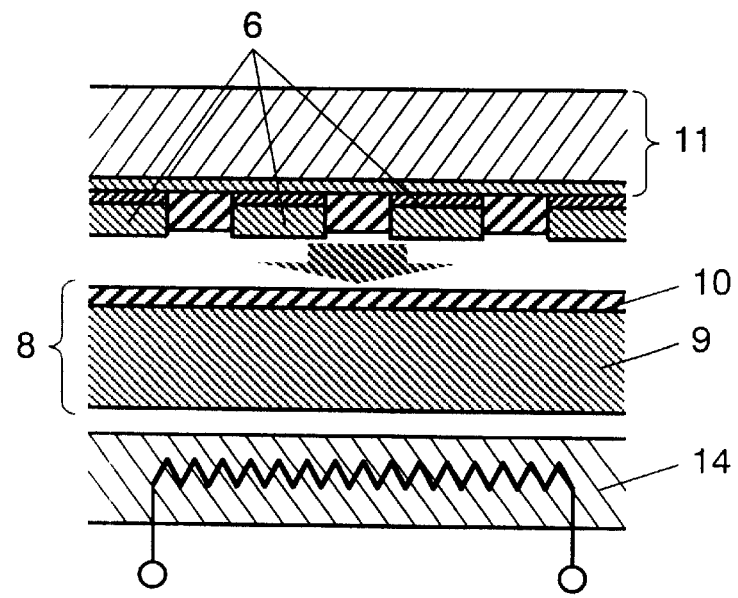
FIG. 5(e) is a cross-sectional view illustrating a step of exfoliation and transferring in the second exemplary embodiment of the present invention.
Figure 5F:
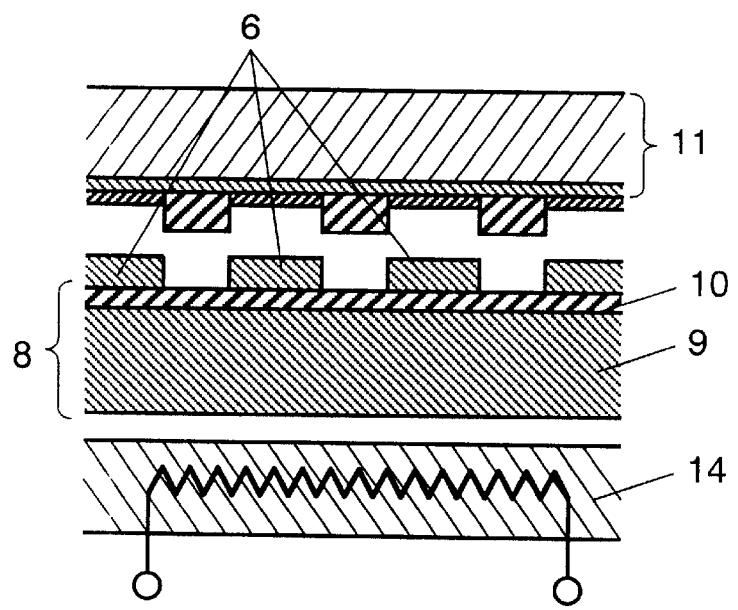
FIG. 5(f) is a cross-sectional view illustrating an essential portion of a fine pattern film exfoliated and transferred in the second exemplary embodiment of the present invention.

FIG. 5(d) is a cross-sectional view illustrating a step of hydration. FIG. 5(e) is a cross-sectional view illustrating a step of exfoliation and transferring. And, FIG. 5(f) is a cross-sectional view illustrating an exfoliated and transferred layer of fine pattern, in the second exemplary embodiment.

First, the film 6 is hydrated with sufficient amount of warm water by immersing the master substrate 11, on which the film 6 is formed by electro-deposition, into warm water 7 of 40° C. for 1 minute, as shown in FIG. 5(d). Next, a substrate 8 composed of a polyimide film 9, on a surface of which a copper foil 10 in thickness of 18 $\mu$m is laminated, is prepared, as shown in FIG. 5(e). The master substrate 11 is then removed from the warm water 7. The film 6 on the master substrate 11 is adhered onto the substrate 8, and the substrate 8 adhered with the film 6 is heated to 70° C. with a heater 14. The film 6 in contact with the master substrate 11 contains moisture internally in advance so that it is in a state of very weak adhesion to the master substrate 11 due to water repellency of the exfoliation layer 5, whereas a surface of the film 6 comes to a state of having tackiness due to the heating. Therefore, the film 6 can be easily transferred completely onto the substrate 8 while maintaining the pattern shape intact, as shown in FIG. 5(f), by separating the master substrate 11 from the substrate 8 under this condition. The master substrate 11 can be used repeatedly for transferring of the film 6, beginning at FIG. 5(d), as a new film 6 is formed again on the master substrate 11 by electro-deposition after the above step of exfoliation and transference.

Figure 6A:
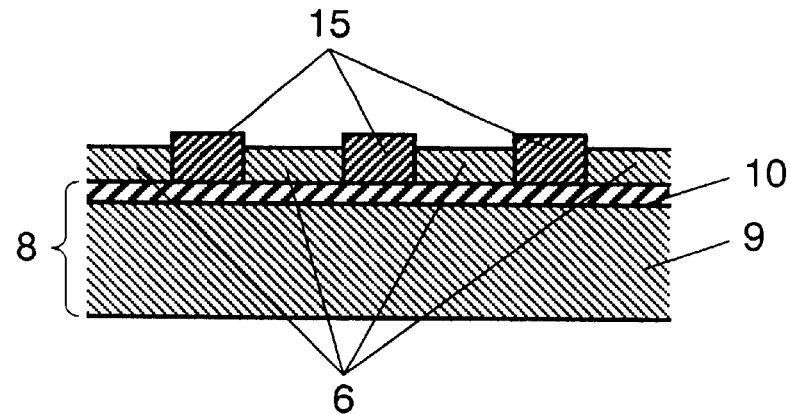
FIG. 6(a) is a cross-sectional view illustrating a step of copper plating in the second exemplary embodiment of the present invention.
Figure 6B:
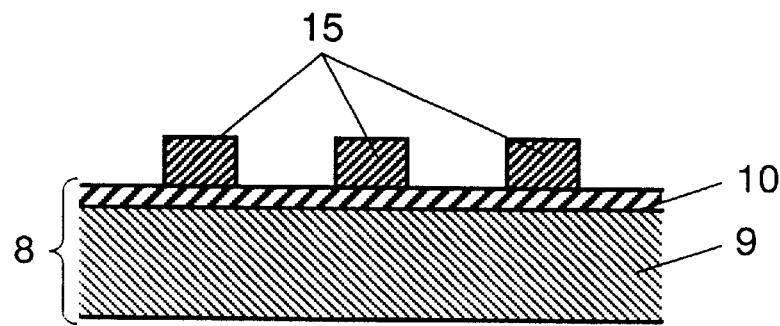
FIG. 6(b) is a cross-sectional view illustrating an essential portion of a plated copper film in the second exemplary embodiment of the present invention.
Figure 6C:
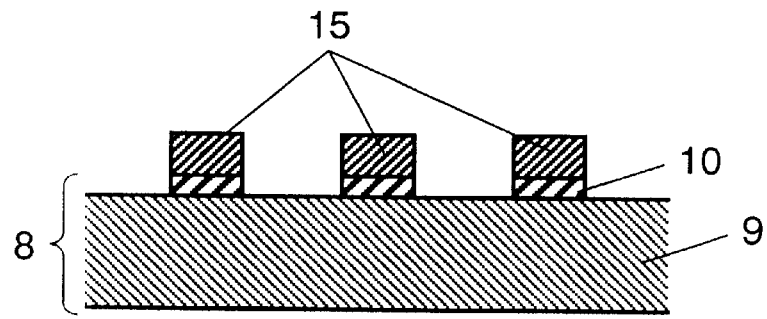
FIG. 6(c) is a cross-sectional view illustrating an essential portion of a copper circuit in the second exemplary embodiment of the present invention.

A step of plating using the film 6 of fine pattern, which is exfoliated and transferred as above onto the substrate 8, as a plating mask, will be described next by referring to FIG. 6(a) through FIG. 6(c).

First, the film 6 transferred on the surface of the substrate 8 is dried by heating it for 30 minutes at 140° C. in order to increase a strength of adhesion to the copper foil 10 on the surface of the substrate 8. Next, a thick film 15 of plated copper is formed by electro-plating on an exposed portion of the copper foil 10 by electro-plating utilizing the heat-dried film 6 as a plating mask, as shown in FIG. 6(a). The film 6 is then removed by aqueous solution of sodium hydroxide heated to 70° C., as shown in FIG. 6(b). A high precision and high density PCB having a fine pattern can be produced with low cost, as shown in FIG. 6(c), by removing further an exposed portion of the copper foil 10 with etching in aqueous solution of iron chloride or the like.

The present exemplary embodiment uses polyimide resin to form the pattern insulation layer 13. Although, this makes it possible to utilize the master substrate 11 with improved durability against immersion into the warm water as well as heating during the exfoliation and transferring, any heat-resistant resin other than polyimide resin can also provide a similar effect. Further, although in the present exemplary embodiment a photo-sensitive heat-resistant resin is used to form the pattern insulation layer 13, an optically-insensitive resin may be used to form the pattern insulation layer 13 by pattern-etching in order to attain a similar effect.

Furthermore, although the present exemplary embodiment uses a metal plate such as copper plate or the like, as the electrically conductive substrate 12, a similar effect can be obtained with an electrically conductive substrate composed of an insulating substrate overlaid with an electrically conductive layer made by sputtering or the like method.

Third Exemplary Embodiment

FIGS. 7(a) and 7(b) are a perspective view in cross-section, and a cross-sectional view illustrating an essential portion of a master substrate for use in manufacturing fine pattern in a method of a third exemplary embodiment, respectively. In FIGS. 7(a) and 7(b), the master substrate 16 comprises an electrically conductive substrate 12, a pattern insulation layer 13, and an insoluble electrode film 4 formed on a portion not covered by the pattern insulation layer 13.

In addition, FIGS. 8(a) and 8(b) are a perspective view in cross-section, and a cross-sectional view illustrating an essential portion of another master substrate for use in manufacturing fine pattern in a method of the present exemplary embodiment. In FIGS. 8(a) and 8(b), a master substrate 17 comprises an electrically conductive substrate 18 having a recessed portion, an insoluble electrode film 4 formed on the electrically conductive substrate 18, and a pattern insulation layer 19 embedded over the insoluble electrode film 4 in the recessed portion. Fine-line and high-density films of fine pattern can be mass-produced reliably with low cost by using either of these master substrates 16 and 17 of the foregoing structures.

Fourth Exemplary Embodiment

Described next is a master substrate of which an electrode layer reduced and deteriorated due to erosion by anion type electro-deposition can be reproduced repeatedly.

Figure 9A:
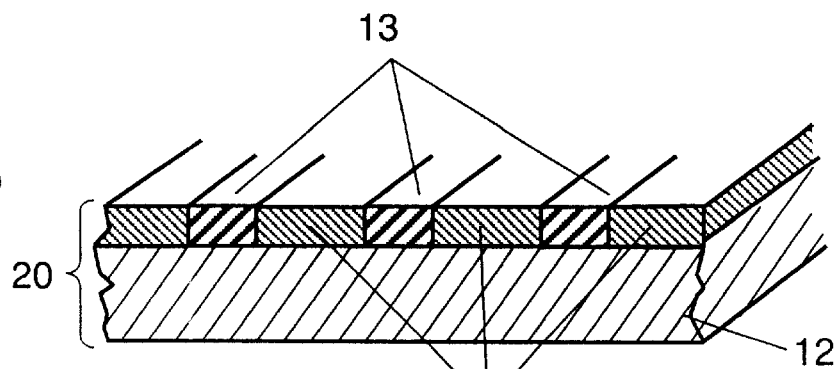
FIG. 9(a) is a perspective view, in cross-section, illustrating an essential portion of a master substrate for use in manufacturing fine pattern by a method of a fourth exemplary embodiment of the present invention.
Figure 9B:
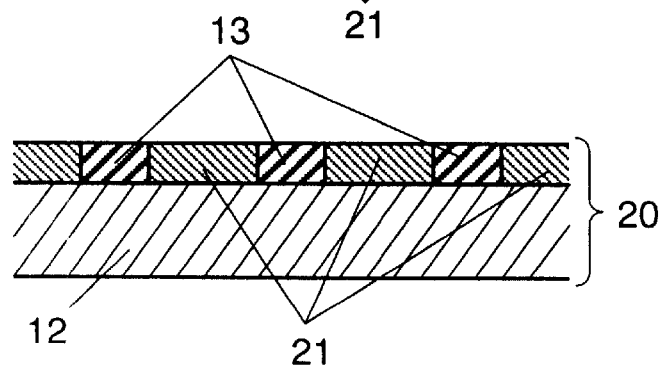
FIG. 9(b) is a cross-sectional view illustrating an essential portion of the master substrate in the fourth exemplary embodiment of the present invention.

FIGS. 9(a) and 9(b) are a perspective view in cross-section, and a cross-sectional view illustrating an essential portion of a master substrate for use in manufacturing fine pattern in a method of the present exemplary embodiment. In FIGS. 9(a) and 9(b), the master substrate 20 comprises an electrically conductive substrate 12, a pattern-shaped insulation layer 13, and a sacrificial electrode film 21 formed of a thin film of nickel, copper, or the like material by plating on a portion not covered by the pattern-shaped insulation layer 13.

As has been described, if the sacrificial electrode film 21 is made of copper, the film is reduced by a thickness of 4 nm due to erosion of copper per each electro-deposition of forming an anion type electro-deposited film in thickness of 2 $\mu$m on the sacrificial electrode film 21. A reduction due to erosion per each electro-deposition is 0.4 nm, in the case of a nickel film. The present exemplary embodiment can reproduce and reuse the master substrate 20 by reforming with plating the sacrificial electrode film 21, i.e. a thin film of nickel, copper, or the like, that has been reduced due to repeated use of the master substrate 20. A plating method is an effective means to reform the sacrificial electrode film 21, since it can form a thin film easily. The present exemplary embodiment can prolong a usable life of the master substrate 20, because the sacrificial electrode film can be reformed easily even if it reduces in thickness due to erosion of the film by the anion type electro-deposition during use of the master substrate 20. In addition, use of the anion type electro-deposition, which generates only a small amount of gas bubbles, realizes mass-production of fine line and high density films of fine pattern reliably at low cost.

Fifth Exemplary Embodiment

Figure 10A:
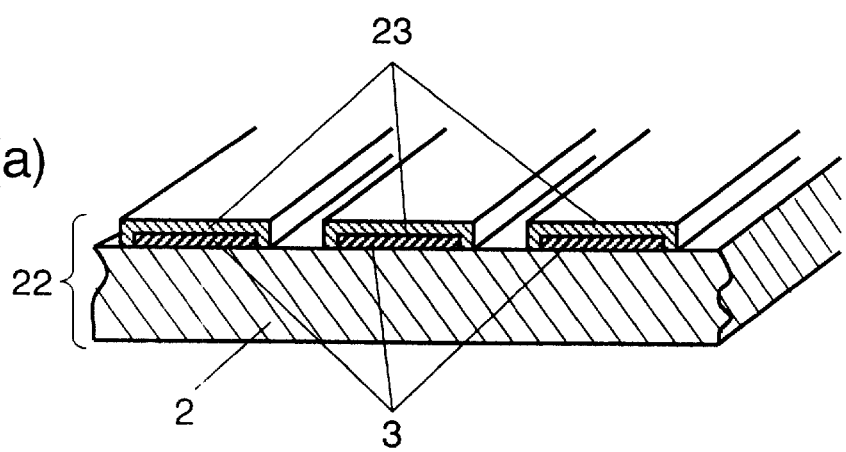
FIG. 10(a) is a perspective view, in cross-section, illustrating an essential portion of a master substrate for use in manufacturing fine pattern by a method of a fifth exemplary embodiment of the present invention.
Figure 10B:
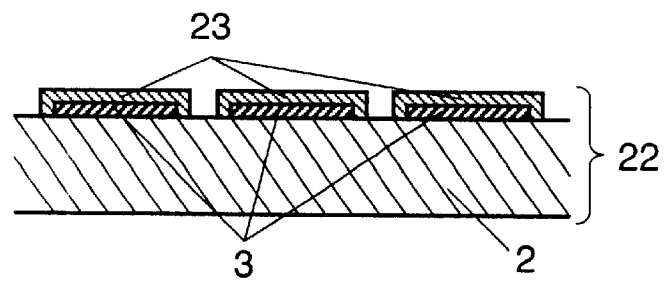
FIG. 10(b) is a cross-sectional view illustrating an essential portion of the master substrate in the fifth exemplary embodiment of the present invention.

FIGS. 10(a) and 10(b) are a perspective view in cross-section, and a cross-sectional view illustrating an essential portion of a master substrate for use in manufacturing fine pattern in a method of a fifth exemplary embodiment. In FIGS. 10(a) and 10(b), a master substrate 22 comprises an insulating substrate 2, a pattern electrode layer 3, and a sacrificial electrode film 23 formed on a surface of the pattern electrode layer 3. Use of the master substrate 22 of this structure in the present exemplary embodiment can prolong a usable life of the master substrate 22, and realize mass-production of fine-line and high-density films of fine pattern reliably at low cost.

The fourth and fifth exemplary embodiments, as has been described, adopt the structure wherein a sacrificial electrode film composed of a thin film of nickel, copper, or the like material formed on an electrically conductive substrate or a pattern electrode layer. These structures allow an insoluble electrode film composed of a precious metal such as gold, platinum, etc. or an alloy thereof, to be provided as a base of the sacrificial electrode film. If an insoluble electrode film is provided, it can help improve reproducibility in reviving the sacrificial electrode film by plating, since it prevents the electrically conductive substrate or the pattern electrode layer from being eroded even if the sacrificial electrode film is completely eroded.

Sixth Exemplary Embodiment

Figure 11A:
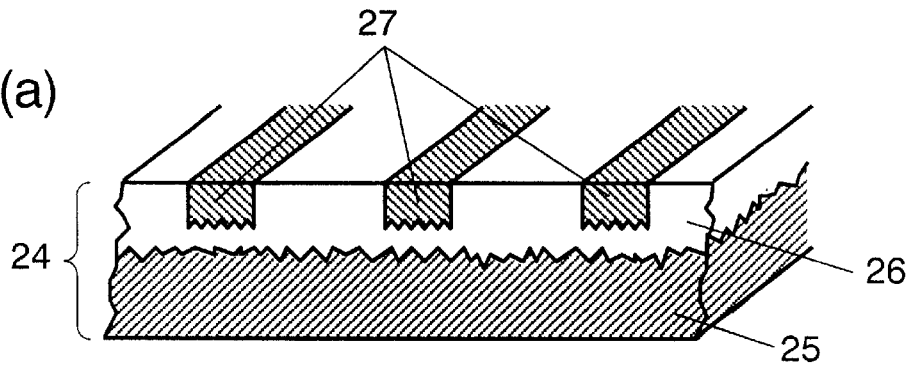
FIG. 11(a) is a perspective view, in cross-section, In illustrating a master substrate in a sixth exemplary embodiment of the present invention.
Figure 11B:
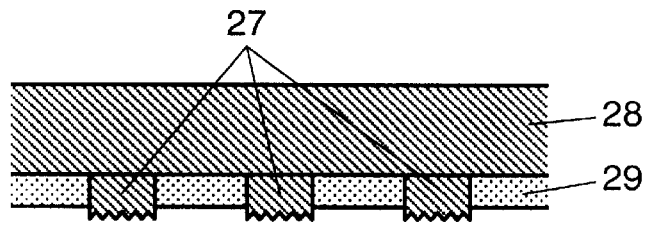
FIG. 11(b) is a cross-sectional view illustrating a step of forming a pattern electrode on an electrically conductive substrate in the sixth exemplary embodiment of the present invention.

FIG. 11(a) is a perspective view, in cross-section, illustrating a master substrate in the present exemplary embodiment. As shown in FIG. 11(b), first, positive-type photoresist is coated in thickness of 10 μm on an electrically conductive substrate 28 by spin coating. A resist layer 29 corresponding to a negative pattern of a pattern electrode 27 is formed by exposing the photo resist through a photo mask, followed by development with aqueous solution of sodium carbonate. Then, the pattern electrode 27 is formed by taking steps of: (a) forming a thin nickel film in thickness of 5.0 μm on a portion not covered by the resist layer 29 with electro-forming; (b) forming a thin copper film in thickness of 5.0 μm on the nickel film with electro-forming; and finally (c) roughening-plating copper on a surface of the pattern electrode 27. The roughening-plating of copper on the surface of the pattern electrode 27 improves a strength of adhesion at an interface between the pattern electrode 27 and an insulation layer 26, as will be described later, thereby improving durability of the pattern electrode 27.

Figure 11C:
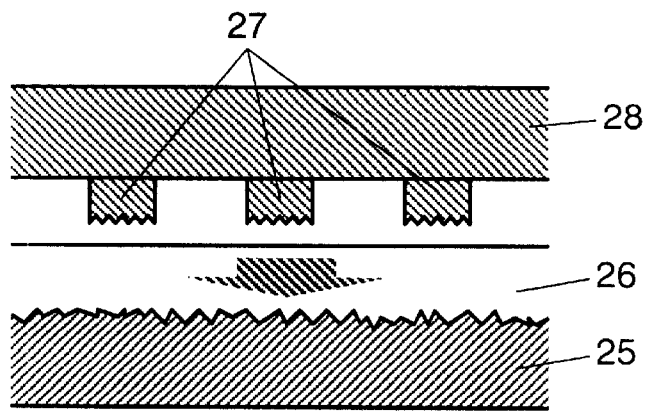
FIG. 11(c) is a cross-sectional view illustrating a step of adhering the electrically conductive substrate with a master substrate in the sixth exemplary embodiment of the present invention.

In a step illustrated in FIG. 11(c), the resist layer 29 is removed next by aqueous solution of sodium hydroxide or the like, to complete the electrically conductive substrate 28 having a fine pattern electrode 27. The resist layer 29 may be left intact without dissolving and removing. A surface of the pattern electrode 27 is then coated with epoxy resin adhesive in thickness of 10 μm by roll-coating to form an insulating adhesive layer. The above noted electrically conductive substrate 28 is heated and adhered to a master substrate 25, a surface of which is roughened and plated with copper, using the insulating adhesive layer. The roughening and plating of the surface occurs in the same process by a special copper plating condition. The insulating adhesive layer is then heat cured to become the insulation layer 26. The roughening and plating of copper on the surface of the master substrate 25 improves an adhesion strength at an interface between the master substrate 25 and the insulation layer 26, so as to improve durability of the master substrate 24.

Figure 11D:
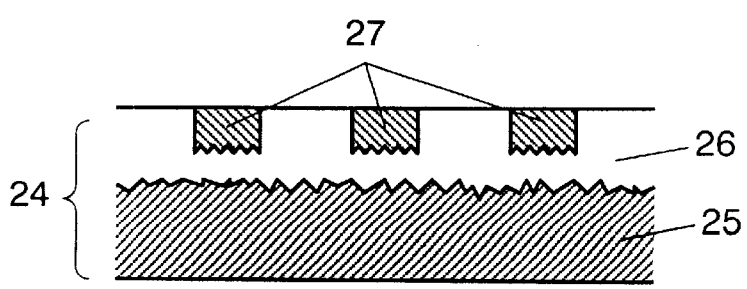
FIG. 11(d) is a cross-sectional view illustrating a step of removing the electrically conductive substrate by etching in the sixth exemplary embodiment of the present invention.

The master substrate 24 having an exfoliated surface of the transferred pattern electrode 27 exposed, as shown in FIG. 11 (a), can be obtained now by separating the electrically conductive substrate 28 in a step of FIG. 11(d). The foregoing steps produce both a surface of the pattern electrode 27 and a surface of the insulation layer 26 in generally the same plane of the master substrate 24, with no bumps and dips, thereby resulting in a superior transfer ability to a substrate. The steps also produce an extremely precise pattern, since the pattern electrode 27 of the master substrate 24 is formed by means of electro-forming. As has been described, the sixth exemplary embodiment can provide the master substrate 24 having a precise pattern and a superior transfer ability.

On the other hand, the master substrate 24 provided with the pattern electrode 27, of which an exfoliated surface from the electrically conductive substrate 28 is exposed, may also be made by removing the electrically conductive substrate 28 by etching in aqueous solution of iron chloride or the like, instead of separating it.

Also, the pattern electrode 27 may be formed after having overlaid a portion where the electrically conductive substrate 28 is not covered by the resist layer 29 with at least two metal films of different kinds among precious metals such as gold, platinum, or an alloy thereof. This produces an insoluble film on the exfoliated surface or the separated surface of the pattern electrode 27. The insoluble film can prevent corrosion and deterioration of the pattern electrode 27 during removal of the electrically conductive substrate 28 by etching, thereby improving reliability of the master substrate 24 with the additional corrosion resistance.

The master substrate 25 may be made of an inorganic material such as glass plate and alumina plate, or an organic material such as polyimide, other than a metallic material such as copper, as a matter of course.

Also, arrangement of an insoluble film on the master substrate can avoid erosion of the electrode due to the anion type electro-deposition. Accordingly, use of the anion type electro-deposition, which generates only a small amount of gas bubbles, can be possible. At the same time a usable life of the master substrate can be prolonged.

Figure 12A:
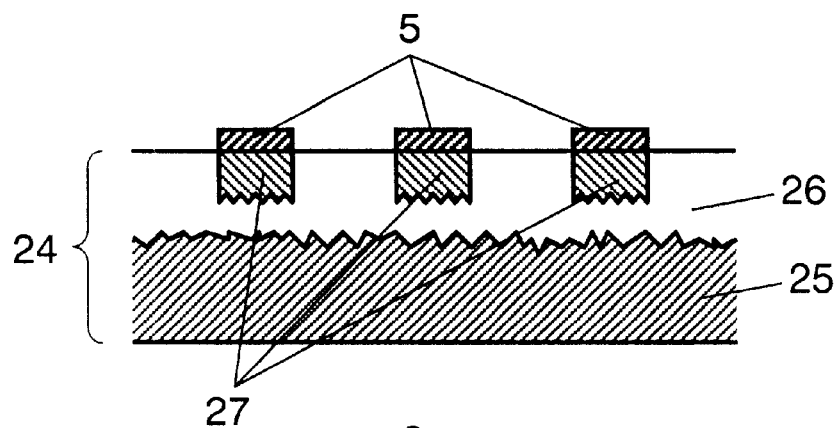
FIG. 12(a) is a cross-sectional view illustrating a master substrate provided with an exfoliation layer on the pattern electrode in the sixth exemplary embodiment of the present invention.
Figure 12B:
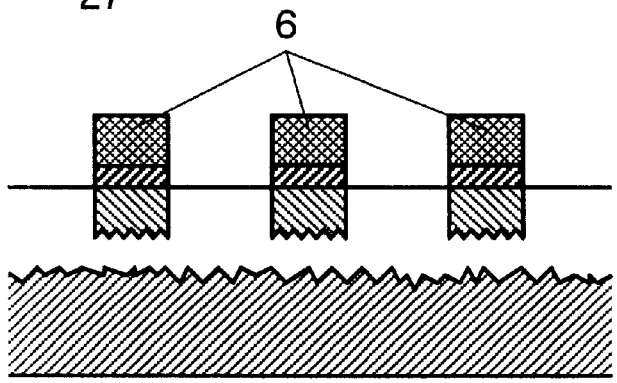
FIG. 12(b) is a cross-sectional view illustrating a master substrate provided with a fine pattern film on the exfoliation layer of the pattern electrode in the sixth exemplary embodiment of the present invention.

A second step for forming a fine pattern film on an exfoliated and transferred surface of the pattern electrode 27 with electro-deposition will be described next with reference to FIG. 12(a) and FIG. 12(b). Elements that are assigned the same reference numerals as those of the FIGS. 11(a), 11(b), 11(c), and 11(d) will not be described in the present exemplary embodiment, since these elements are basically identical to each other. An exfoliation layer 5 formed on the pattern electrode 27 is made of a material having water-repellency and electric conductivity in an electro-deposition bath. A film 6 of fine pattern is formed on a surface of the exfoliation layer 5. The film 6 is produced by electro-deposition in an electro-deposition bath filled with an anion type acrylic resin, and has a thickness of 2 μm. The electro-deposition bath contains phthalocyanine blue pigment in a concentration of 30 ml/l.

A third step for transferring the film 6 onto a substrate to be transferred will be described next with reference to FIG. 13(a), FIG. 13(b) and FIG. 13(c).

Figure 13A:
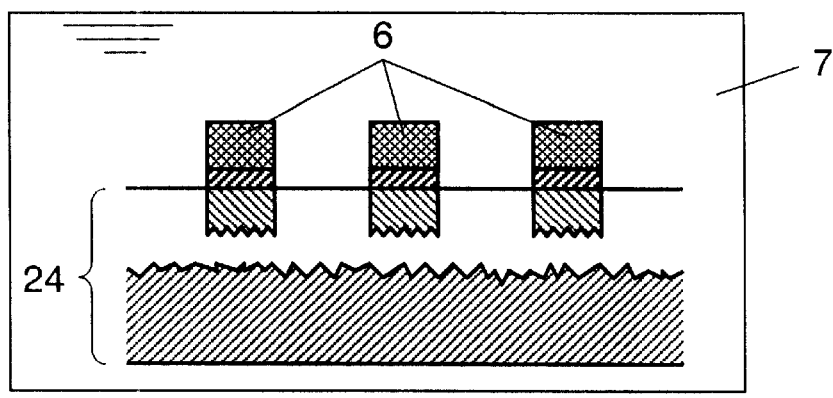
FIG. 13(a) illustrates a step of hydration for impregnating hot water into the fine pattern film provided on the exfoliation layer in the sixth exemplary embodiment of the present invention.
Figure 13B:
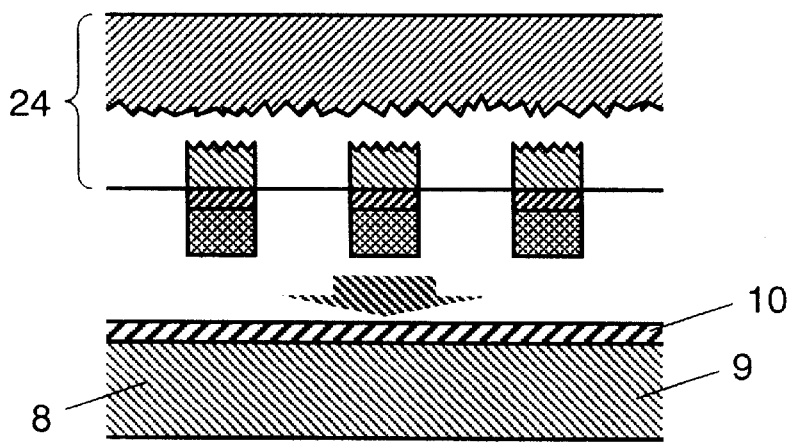
FIG. 13(b) illustrates a step of exfoliation and transferring of the fine pattern film on the master substrate onto a substrate subject to be transferred in the sixth exemplary embodiment of the present invention.
Figure 13C:
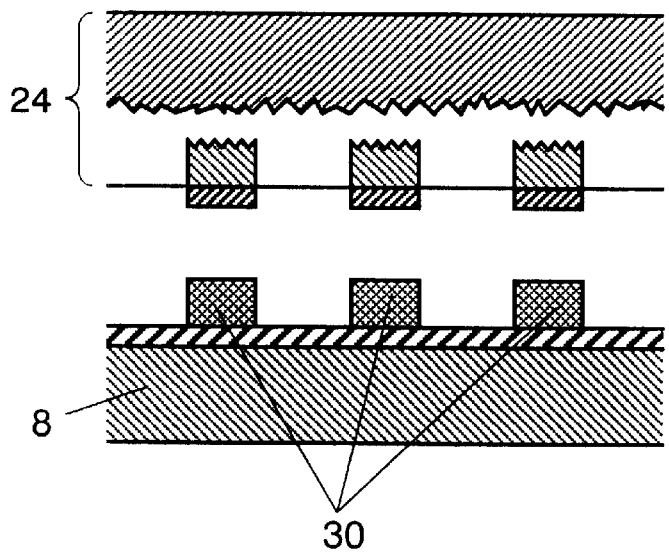
FIG. 13(c) is a cross-sectional view illustrating the substrate subject to be transferred after the fine pattern film is exfoliated and transferred in the sixth exemplary embodiment of the present invention.

The film 6 is hydrated with sufficient amount of hot water, and is warmed up by immersing the master substrate 24 having the exfoliation layer 5 and the film 6 formed thereon into a hot water bath 7 of 70° C. for 1 minute, as shown in FIG. 13(a). The immersion of the master substrate 24 into the hot water bath 7 impregnates water into the film 6, and turns the film 6 into a state of very weak adhesion to the master substrate 24 due to water repellency of the exfoliation layer 5. At the same time, the film 6 is warmed up to have a tackiness. After removing the master substrate 24 from the hot water bath 7, the master substrate 24 is adhered to the substrate 8 with pressure, as shown in FIG. 13(b). The film 6 can be easily exfoliated and transferred onto the substrate 8, as shown in FIG. 13(c), when the master substrate 24 is separated from the substrate 8 after keeping them adhered together for a predetermined period of time. In such way a fine pattern 30 of high precision can be obtained. The master substrate 24 can be utilized repeatedly for exfoliation and transferring of the film 6 to the substrate 8, beginning at FIG. 12(b), as a new film 6 is formed again on the master substrate 24 by electro-deposition after the above step of exfoliation and transference.

The pattern electrode 27 of the master substrate 24 obtained in FIG. 11(d) will be described with regard to its protruding height from the insulation layer 26. In order to make surfaces of pattern electrodes 27 to extrude from a surface of the insulation layer 26, the surfaces of the pattern electrodes 27 were electro-plated to form thin nickel films, so that the pattern electrodes 27 had protruding heights of 0.0 µm, 0.2 µm, 0.5 µm, 0.7 µm, 1.0 µm, and 1.5 µm. Then, films 6 on the master substrates 24 having the above noted protruding heights electrode were electro-deposited, and transfer ability of fine patterns 30 were evaluated. The pattern electrodes 27 having protruding heights of 1.0 µm or less showed good transfer ability, as fine patterns 30 on substrates 8 did not exhibit any deterioration in their pattern shapes after the transferring. However, the pattern electrode 27 having the protruding height of 1.5 µm exhibited deterioration in pattern shape of a fine pattern 30, because electro-deposited resin stuck on side surfaces beside a top surface of the pattern electrode 27. And the resin stuck on side surfaces spread, and/or stayed on the pattern electrode 27 during exfoliation and transferring. Accordingly, protruding height of the pattern electrode 27 from the surface of the insulation layer 26 shall preferably be 1.0 µm or less. Although even this height causes the electro-deposited resin to stick on side surfaces of the pattern electrode 27, the effect is small enough to be negligible.

Seventh Exemplary Embodiment

Figure 14A:
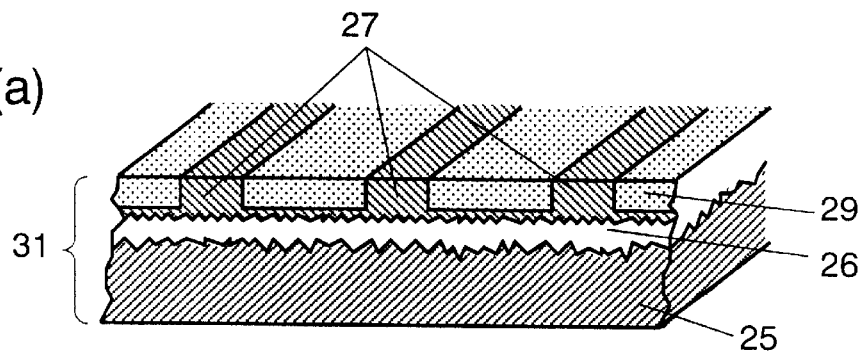
FIG. 14(a) is a perspective view illustrating a master substrate in a seventh exemplary embodiment of the present invention.
Figure 14B:
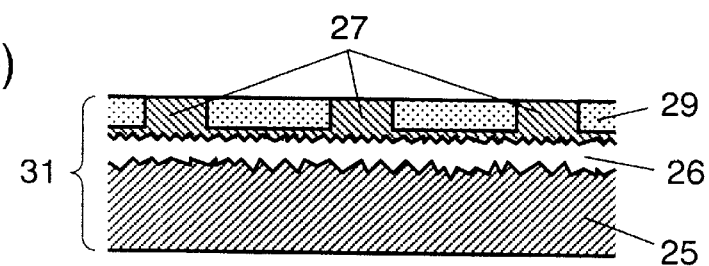
FIG. 14(b) is a cross-sectional view illustrating the master substrate in the seventh exemplary embodiment of the present invention.
Figure 15A:
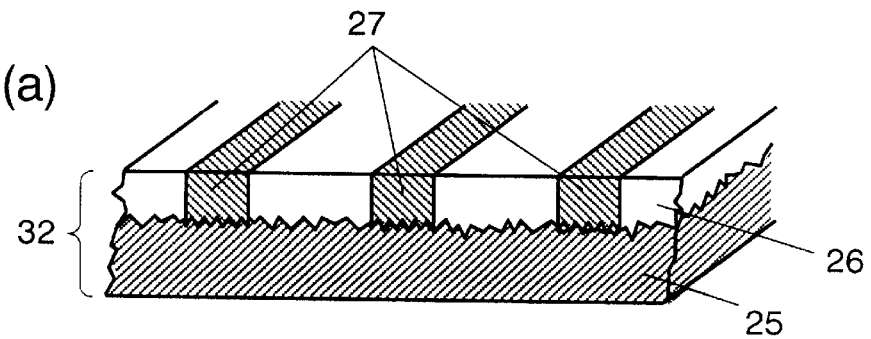
FIG. 15(a) is a perspective view illustrating another master substrate in the seventh exemplary embodiment of the present invention.
Figure 15B:
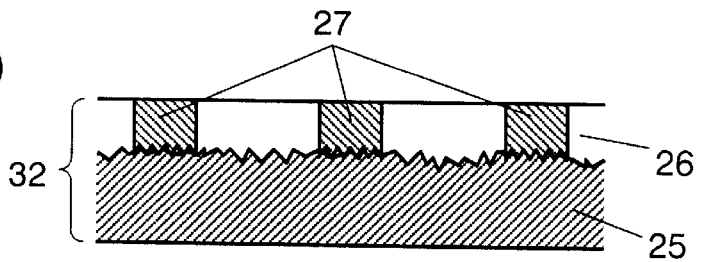
FIG. 15(b) is a cross-sectional view illustrating another master substrate in the seventh exemplary embodiment of the present invention.

An even more practical method of manufacturing a master substrate will be described with reference to FIGS. 14(a) and 14(b), and also FIGS. 15(a) and 15(b). FIG. 14(a) and FIG. 14(b) are a perspective view and a cross-sectional view illustrating a master substrate in a seventh exemplary embodiment of the present invention. FIG. 15(a) and FIG. 15(b) are a perspective view and a cross-sectional view illustrating another master substrate in the present exemplary embodiment.

FIGS. 14(a) and 14(b) illustrate a master substrate 31 produced by the same steps as those of FIGS. 11(c) and 11(d), after making an electrical continuity between pattern electrodes 27 illustrated in FIG. 11(b) at a point where needed. The present exemplary embodiment can make an electrical continuity between adjacent pattern electrodes 27 through an inside of an insulation layer 26, so as to increase flexibility in designing a pattern, since this allows formation of fine patterns 30 (shown in FIG. 13(c)) by making continuity between pattern electrodes 27 of any shape, e.g. a shape of isolated island.

FIGS. 15(a) and 15(b) illustrate a master substrate 32 produced by the same steps as those of FIGS. 11(c) and 11(d), while maintaining a thickness of an insulation layer 26 approximately equal to a predetermined pattern electrode 27 illustrated in FIG. 11(b). The present exemplary embodiment can make an electrical continuity between adjacent pattern electrodes 27, which penetrate through an insulation layer 26, and through a master substrate 25, so as to increase flexibility in designing a pattern in the like manner as that of FIG. 14(b).

Mass-production of fine line and even complicated PCB's can be obtained with high quality, as will be touched on later, if a fine pattern 30 is produced using any of the master substrates 31 and 32 illustrated in FIGS. 14(a), 14 (b), 15(a) and 15(b), and is used as a plating mask or the like.

Eighth Exemplary Embodiment

A method of manufacturing a master substrate will be described with reference to FIG. 16, FIGS. 17(a), 17(b) and 17(c), as well as FIGS. 18(a), 18(b) and 18(b). The master substrate in the present exemplary embodiment is provided with a positioning marker on a surface of the master substrate having a transparency of at least one part thereof. And transferring fine pattern film can be made by optically aligning the positioning marker of the master substrate with a substrate to be transferred.

Figure 16:
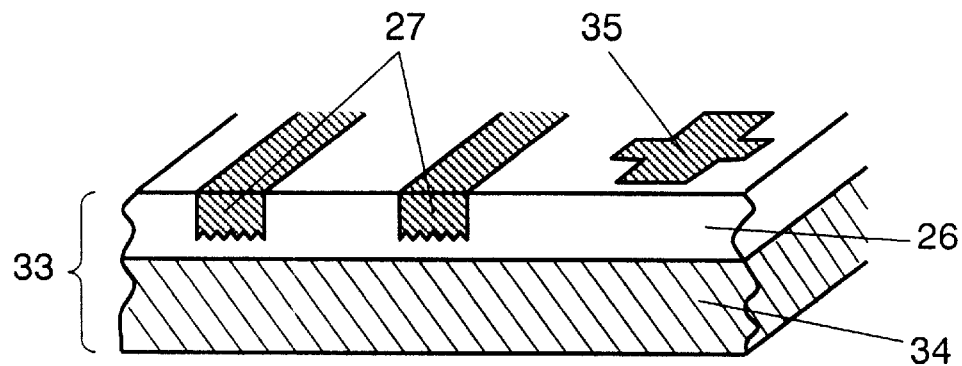
FIG. 16 is a perspective view, in cross-section, illustrating a master substrate in an eighth exemplary embodiment of the present invention.
Figure 17A:
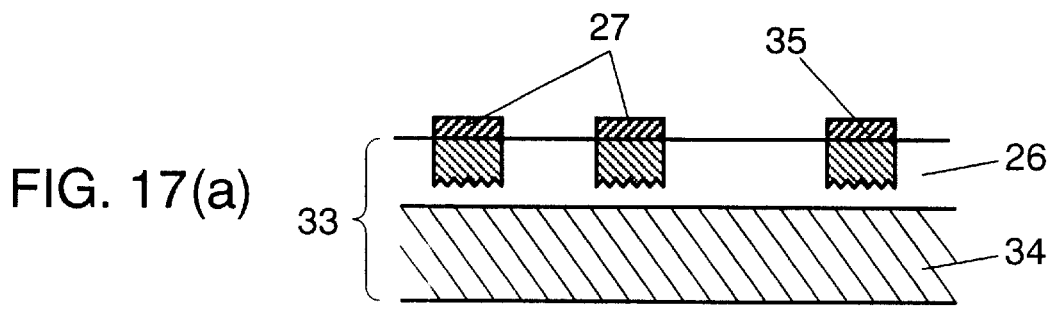
FIG. 17(a) is a cross-sectional view illustrating the master substrate provided with a positioning marker in the eighth exemplary embodiment of the present invention.
Figure 17B:
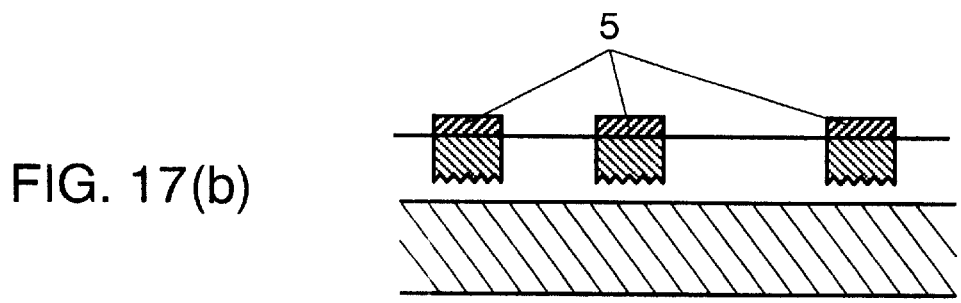
FIG. 17(b) is a cross-sectional view illustrating the master substrate provided with an exfoliation layer on a pattern electrode in the eighth exemplary embodiment of the present invention.
Figure 17C:
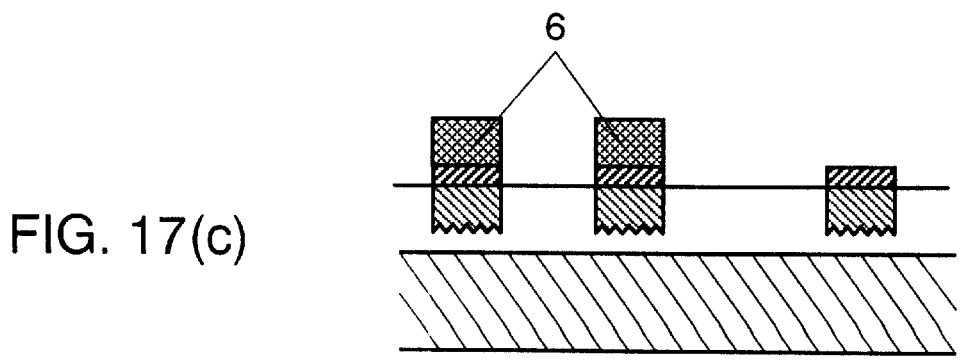
FIG. 17(c) is a cross-sectional view illustrating the master substrate provided with a fine pattern film on the exfoliation layer of the pattern electrode in the eighth exemplary embodiment of the present invention.

FIG. 16 is a perspective view, in cross-section, illustrating the master substrate in the present exemplary embodiment. FIG. 17(a) is a cross-sectional view illustrating the master substrate provided with a positioning marker. FIG. 17(b) is a cross-sectional view illustrating the master substrate provided with an exfoliation layer on a pattern electrode. And FIG. 17(c) is a cross-sectional view illustrating the master substrate provided with a fine pattern film on the exfoliation layer of the pattern electrode. All of FIGS. 17(a), 17(b), and 17(c) illustrate the present exemplary embodiment.

Figure 18A:
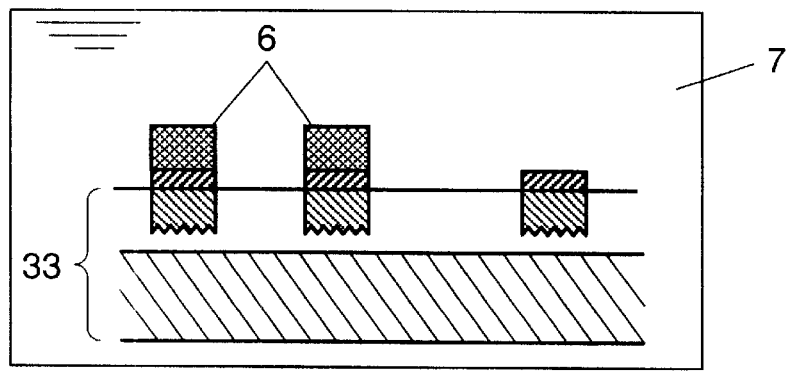
FIG. 18(a) illustrates a step of hydration for impregnating hot water into the fine pattern film provided on the exfoliation layer in the eighth exemplary embodiment of the present invention.
Figure 18B:
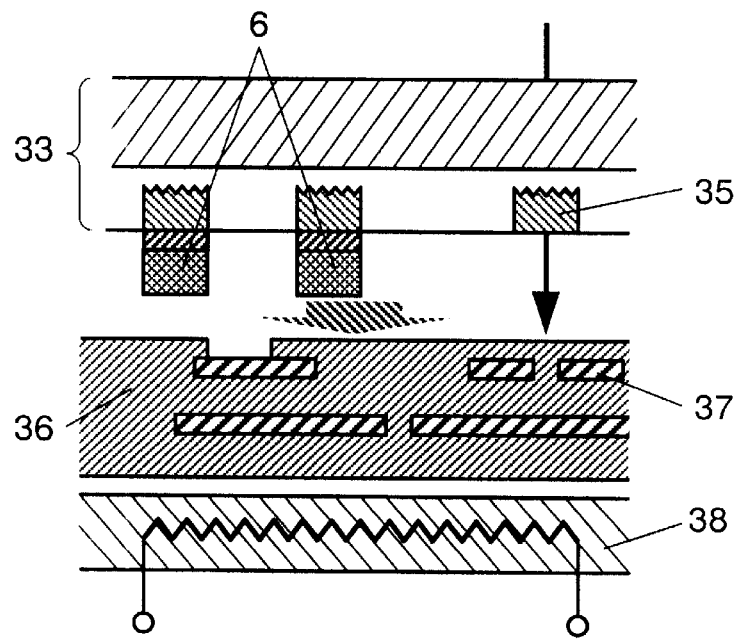
FIG. 18(b) illustrates a step of exfoliation and transference of the fine pattern film on the master substrate onto a substrate subject to be transferred in the eighth exemplary embodiment of the present invention.
Figure 18C:
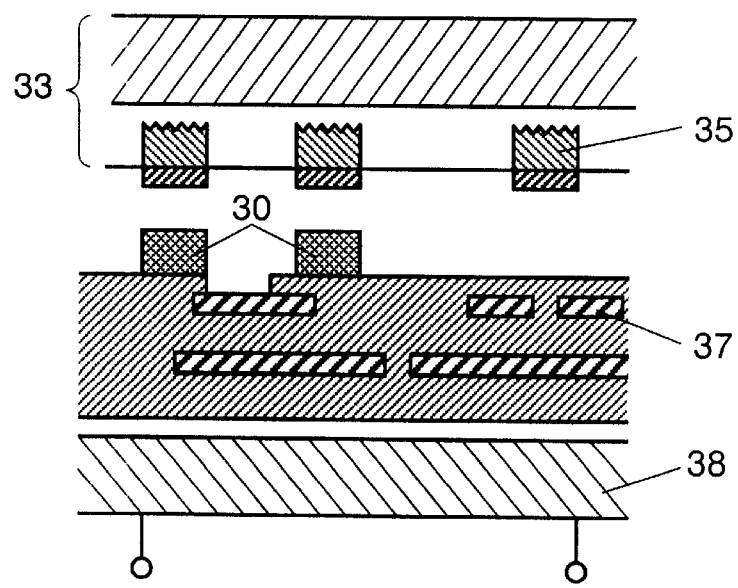
FIG. 18(c) is a cross-sectional view illustrating the substrate subject to be transferred, on which the fine pattern film is exfoliated and transferred in the eighth exemplary embodiment of the present invention.

FIG. 18(a) illustrates a step of hydration for impregnating hot water into the fine pattern film 6 provided on the exfoliation layer. FIG. 18(b) illustrates a step of exfoliating and transferring the fine pattern film 6 onto a multi-layered PCB. And FIG. 18(c) is a cross-sectional view of a multi-layered PCB, on which the fine pattern film is exfoliated and transferred. All of FIGS. 18(a), 18(b) and 18(c) illustrate the present exemplary embodiment.

In FIG. 16, a master substrate 33 is provided with a substrate 34 having transparency such as glass or the like, and a positioning marker 35 for positional alignment through an insulation layer 26 also having transparency. A first step of manufacturing the master substrate 33 is same as the previously described step in FIGS. 11(a), 11(b), 11(c) and 11(d).

Using the master substrate 33, a film 6 is formed by electro-deposition on a surface of an exfoliation layer 5 through a process of a second step shown in FIGS. 17(a), 17(b) and 17 (c). The second step is essentially same as that described with reference to FIGS. 12(a) and 12(b), except that the master substrate 33 is provided with the positioning marker 35.

A third step for exfoliating and transferring the film 6 onto a multi-layered PCB 36 by using the master substrate 33 will be described next.

The film 6 is hydrated with sufficient amount of hot water by immersing the master substrate 33 into a hot water bath 7 of 70° C. for 1 minute, as shown in FIG. 18(a). A surface of the PCB 36 having an objective positioning marker 37 is treated with electroless plating catalyst. After removing the master substrate 33 from the hot water bath 7, the film 6 on the master substrate 33 is positionally aligned with the PCB 36, and they are adhered and pressed together, as shown in FIG. 18(b). Since the substrate 34 is transparent, the positioning marker 35 can be observed from behind of the master substrate 33 (in a direction of an arrow). Hence, an alignment between the positioning marker 35 and the positioning marker 37 can be made accurately. The PCB 36 adhered by the film 6 is heated to 70° C. with a heater 38, and the master substrate 33 being pressed is removed from the PCB 36. As a result, the film 6 can be easily exfoliated and transferred onto the PCB 36, and the fine pattern 30 can be formed, as shown in FIG. 18(c). The master substrate 33 can be utilized repeatedly for exfoliation and transferring of the film 6 to the PCB 36, beginning at FIG. 17(a), as a new film 6 is formed again on the master substrate 33 by electro-deposition after the above step of exfoliation and transferring.

Although a glass plate is used as the material of the substrate 34 in this exemplary embodiment, other inorganic material having transparency such as alumina plate or the like may be used. Or, any organic material having transparency such as polycarbonate resin, acrylic resin, polyvinyl chloride, or the like may also be used.

Ninth Exemplary Embodiment

Figure 19A:
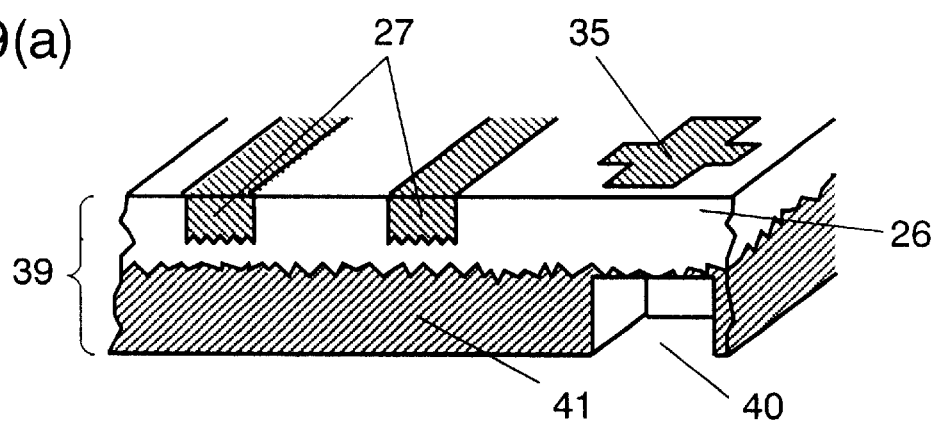
FIG. 19(a) is a perspective view illustrating a master substrate provided with an opening in a ninth exemplary embodiment of the present invention.
Figure 19B:
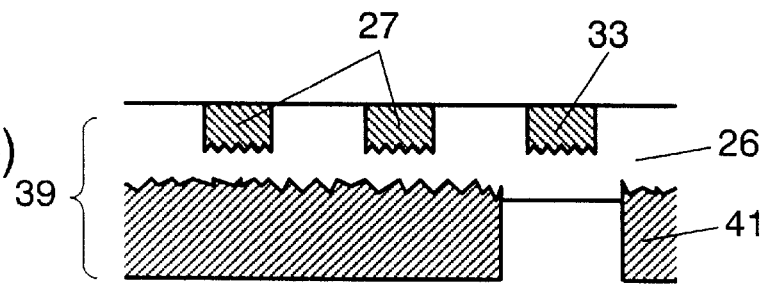
FIG. 19(b) is a cross-sectional view illustrating the master substrate provided with the opening in the ninth exemplary embodiment of the present invention.

Referring to FIGS. 19(a) and 19(b), described hereinafter is an exemplary embodiment wherein a nontransparent substrate, provided with a transparent section in a portion thereof, is adopted in place of the transparent substrate used in the eighth exemplary embodiment. FIG. 19(a) is a perspective view illustrating a master substrate provided with an opening in the present exemplary embodiment, and FIG. 19(b) is a cross-sectional view of the same master substrate. The master substrate 39 comprises a substrate 41 of a copper plate having an opening 40, and a positioning marker 35 located above the opening 40 for positional alignment through a transparent insulation layer 26, as shown in FIG. 19(a). The foregoing structure can provide the same effect as in the case of using a transparent substrate, as the positioning marker 35 can be observed from behind of the master substrate 39.

Tenth Exemplary Embodiment

Figure 20A:
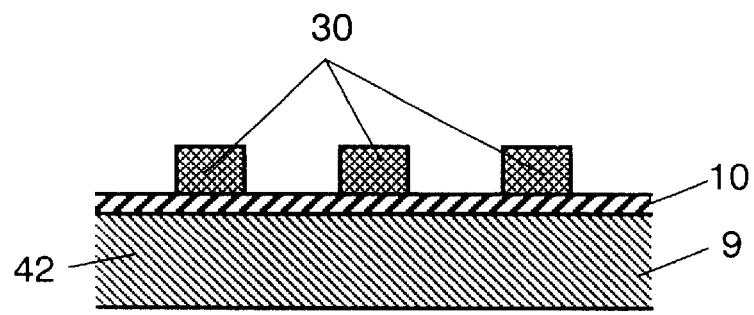
FIG. 20(a) is a cross-sectional view illustrating a copper clad laminate, of which a fine pattern is formed on a surface of a copper foil in a tenth exemplary embodiment of the present invention.
Figure 20B:
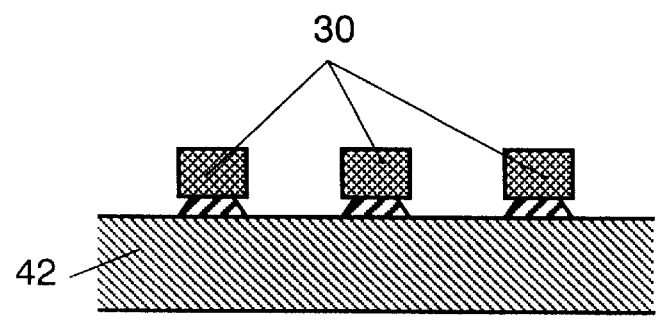
FIG. 20(b) is a cross-sectional view illustrating the printed circuit board, of which the copper foil is removed by etching in the tenth exemplary embodiment of the present invention.
Figure 20C:
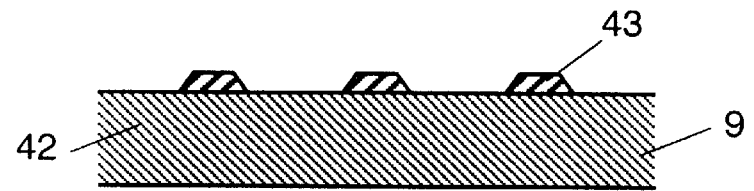
FIG. 20(c) is a cross-sectional view illustrating the printed circuit board in the tenth exemplary embodiment of the present invention.

Referring now to FIGS. 20(a), 20(b) and 20(c), described hereinafter is a method of manufacturing a PCB using a fine pattern as an etching mask. The fine pattern used here has been obtained as it has been exfoliated and transferred on a surface of the copper clad laminates in the step of FIGS. 13(a), 13(b) and 13(c). This method is called a subtracting method.

FIG. 20(a) is a cross-sectional view illustrating a copper clad laminate formed with fine pattern of the present invention. FIG. 20(b) is a cross-sectional view illustrating the PCB, of which a copper foil is removed by etching. And FIG. 20(c) is a cross-sectional view illustrating the PCB of the present exemplary embodiment.

First, a fine pattern 30 transferred on a surface of a copper clad laminate 42, as illustrated in FIG. 20(a), is dried by heating it for 30 minutes at 140° C. in order to increase an adhesion strength to a copper foil 10. Next, an exposed portion of the copper foil 10 is removed by etching with aqueous solution of iron chloride or the like by utilizing the heat-dried fine pattern 30 as an etching mask, as shown in FIG. 20(b). A copper circuit 43 in a shape of the fine pattern is formed, as shown in FIG. 20 (c), when the fine pattern 30 is removed by aqueous solution of sodium hydroxide heated to 70° C. The foregoing steps can easily produce a high precision and high density PCB 42.

Eleventh Exemplary Embodiment

Figure 21A:
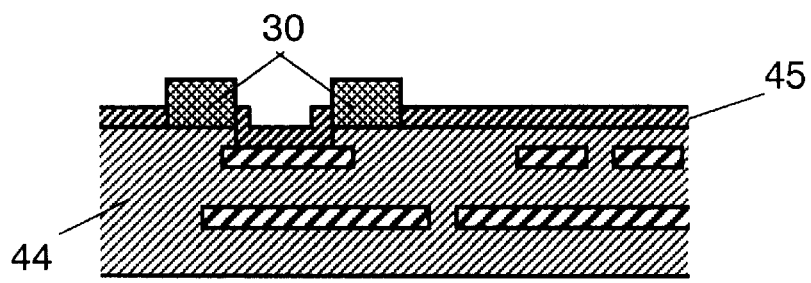
FIG. 21(a) is a cross-sectional view illustrating a printed circuit board, on which fine pattern is exfoliated and transferred in an eleventh exemplary embodiment of the present invention.
Figure 21B:
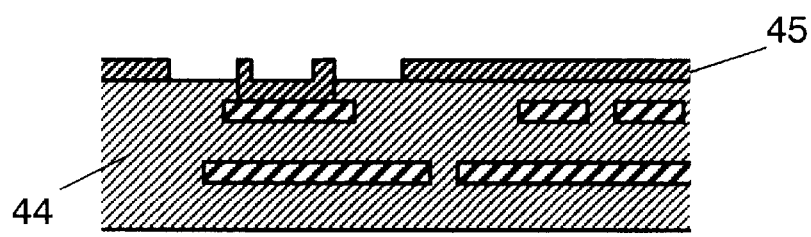
FIG. 21(b) is a cross-sectional view illustrating the printed circuit board, on which copper circuit is formed in the eleventh exemplary embodiment of the present invention.

A method of manufacturing a PCB using a fine pattern exfoliated and transferred on a surface of a multi-layered PCB as a plating mask will be described by referring to FIGS. 21(a) and 21(b). This method is called an additive method. FIG. 21(a) is a cross-sectional view illustrating a PCB on which a fine pattern is exfoliated and transferred, and FIG. 21(b) is a cross-sectional view illustrating the PCB produced in the present exemplary embodiment.

First, a PCB 44, on which a fine pattern 30 is transferred on a surface thereof is dried by heating it for 30 minutes at 140° C. in order to increase an adhesion strength of the fine pattern 30 to the PCB 44 as shown in FIG. 21(a). Then a film 45 of plated copper is formed on an exposed portion of the PCB 44 with electroless plating by utilizing the fine pattern 30 as a plating mask. A high precision and high density PCB 44 formed with a copper circuit corresponding to the fine pattern 30, as shown in FIG. 21(b), is produced, when the fine pattern 30 is removed by aqueous solution of sodium hydroxide heated to 70° C.

As has been described, the method of manufacturing fine pattern of the present invention can improve durability and prolong a usable life of the master substrate, and thereby the invention provides an advantageous effect of a reliable mass production method of fine-line and high-density films of fine pattern at low cost.

Also, the method of manufacturing fine pattern of the present invention can improve transferability and accuracy, as well as it can prolong a usable life of the master substrate. And thereby the invention provides an effect of a reliable mass production method of fine-line and high-density films of fine pattern at low cost.

For the above reasons, the method of manufacturing fine pattern of the present invention is particularly useful for manufacturing PCB's. The present invention can provide a method of mass production of PCB's of fine line and high density at low cost with high yield.

Further, the PCB's of the present invention have such a structure that fine pattern can be transferred easily with high accuracy of alignment, and thereby the invention is particularly effective in manufacturing high-density and multi-layered printed circuit boards.

Although descriptions in the foregoing exemplary embodiment have made reference only to precious metals as material of the insoluble electrode, other kinds of material may be used such as ruthenium oxide and solid solution thereof, that are used generally in the electrolytic industry and the like as an insoluble electrode.

What is claimed is:

1. A method of manufacturing a fine pattern comprising:
   (a) producing a master substrate comprising a process of forming a pattern-shaped insulation layer on a surface of an electrically conductive substrate, and a process of forming an insoluble electrode film on a portion not covered by said pattern-shaped insulation layer, said insoluble electrode film comprising a precious metal or an alloy thereof;
   (b) forming a fine pattern film on said insoluble electrode film with anion type electro-deposition and
   (c) transferring said fine pattern film on a substrate to be transferred.

2. A method of manufacturing a fine pattern, comprising:
   (a) producing a master substrate comprising a process of forming an insoluble electrode film on a surface of an electrically conductive substrate, and a process of forming a pattern insulation layer on a surface of said insoluble electrode film, said insoluble electrode film comprising a precious metal or an alloy thereof;

(b) forming a fine pattern film on said insoluble electrode film with anion type electro-deposition; and (c) transferring said fine pattern film on a substrate to be transferred.

3. A method of manufacturing a fine pattern, comprising (a) producing a master substrate comprising a process of forming an insoluble electrode film on a surface of an electrically conductive substrate having a recessed portion, and a process of forming an insulation layer in said recessed portion, said insoluble electrode film comprising a precious metal or an alloy thereof;

(b) forming a fine pattern film on said insoluble electrode film with anion type electro-deposition; and (c) transferring said fine pattern film on a substrate to be transferred.

4. The method of manufacturing fine pattern according to any one of claim 1 through claim 3, wherein the difference in level between a surface of said insoluble electrode film and a surface of said insulation layer is less than 1.0 $\mu$m.

5. A method of manufacturing a printed circuit board comprising:

(a) producing a master substrate having at least an insoluble electrode film formed on a surface thereof;

(b) forming a fine pattern film on said insoluble electrode film with an anion type electro-deposition;

(c) exfoliating and transferring said fine pattern film onto a substrate comprising an insulating substrate and a metal foil; and (d) removing said metal foil by etching using said fine pattern film as an etching mask.

6. A method of manufacturing a printed circuit board comprising:

(a) producing a master substrate having at least an insoluble electrode film formed on a surface thereof;

(b) forming a fine pattern film on said insoluble electrode film with an anion type electro-deposition;

(c) transferring said fine pattern film onto an electrically conductive substrate;

(d) forming a metal film on said electrically conductive substrate by plating using said fine pattern film as a plating mask; and (e) transferring said metal film onto an insulating substrate.

7. A printed circuit board manufactured by a process comprising:

(a) producing a master substrate having at least an insoluble electrode film formed on a surface thereof;

(b) forming a fine pattern film on said insoluble electrode film with an anion type electro-deposition;

(c) transferring said fine pattern film onto an electrically conductive substrate;

(d) forming a metal film on said electrically conductive substrate by plating using said fine pattern film as a plating mask; and (e) transferring said metal film onto an insulating substrate.

* * * * *